(12) United States Patent
Sato et al.

(10) Patent No.: US 11,081,438 B2
(45) Date of Patent: Aug. 3, 2021

(54) METHOD OF MANUFACTURING SEMICONDUCTOR DEVICE

(71) Applicant: RENESAS ELECTRONICS CORPORATION, Tokyo (JP)

(72) Inventors: Yoshiaki Sato, Tokyo (JP); Yoshinori Miyaki, Tokyo (JP); Junichi Arita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 23 days.

(21) Appl. No.: 16/547,294

(22) Filed: Aug. 21, 2019

(65) Prior Publication Data
US 2020/0098679 A1    Mar. 26, 2020

(30) Foreign Application Priority Data
Sep. 20, 2018  (JP) .............................. JP2018-176123

(51) Int. Cl.
| H01L 23/498 | (2006.01) |
| H01L 23/00 | (2006.01) |
| H01L 23/31 | (2006.01) |
| H01L 21/56 | (2006.01) |

(Continued)

(52) U.S. Cl.
CPC .... *H01L 23/49838* (2013.01); *H01L 21/4853* (2013.01); *H01L 21/561* (2013.01); *H01L 21/565* (2013.01); *H01L 21/78* (2013.01); *H01L 23/3128* (2013.01); *H01L 24/48* (2013.01); *H01L 2224/48227* (2013.01)

(58) Field of Classification Search
CPC ........... H01L 23/49838; H01L 21/4853; H01L 21/561; H01L 21/565; H01L 21/78; H01L 23/3128; H01L 24/48; H01L 2224/48227
See application file for complete search history.

(56) References Cited

U.S. PATENT DOCUMENTS

| 6,602,734 B1 | 8/2003 | Wada et al. | |
| 2007/0290310 A1* | 12/2007 | Kusano | ............... H01L 23/3121 |
| | | | 257/684 |

(Continued)

FOREIGN PATENT DOCUMENTS

| JP | 2005-100293 A | 4/2005 |
| JP | 2013-138263 A | 7/2013 |

*Primary Examiner* — Zandra V Smith
*Assistant Examiner* — Andre C Stevenson
(74) *Attorney, Agent, or Firm* — McDermott Will & Emery LLP

(57) ABSTRACT

An object of the present invention is to improve manufacturing efficiency of a semiconductor device. The method of manufacturing a semiconductor device includes a sealing step of sealing a semiconductor chip mounted on the wiring substrate. The sealing step includes a step of arranging the wiring substrate between an upper mold and a lower mold, suctioning a lower surface of the wiring substrate with the plurality of suction holes, thereby holding the wiring substrate the upper mold, and a step of sealing the semiconductor chip, an upper surface of the wiring substrate, and the plurality of side surfaces of the wiring substrate such that each of the semiconductor chip, the upper surface of the wiring substrate, and the plurality of side surfaces of the wiring substrate is covered with the resin in the lower mold.

10 Claims, 30 Drawing Sheets

(51) Int. Cl.
  *H01L 21/78*  (2006.01)
  *H01L 21/48*  (2006.01)

(56) References Cited

U.S. PATENT DOCUMENTS

2011/0089563 A1* 4/2011 Kikuchi ................ H01L 25/105
　　　　　　　　　　　　　　　　　　　257/738
2017/0207105 A1* 7/2017 Kasai ...................... B29C 33/68

* cited by examiner

METHOD OF MANUFACTURING SEMICONDUCTOR DEVICE

CROSS-REFERENCE TO RELATED APPLICATIONS

The disclosure of Japanese Patent Application No. 2018-176123 filed on Sep. 20, 2018 including the specification, drawings and abstract is incorporated herein by reference in its entirety.

BACKGROUND OF THE INVENTION

The present invention relates to a technique for manufacturing a semiconductor device, and, for example, to a technique effective for application to a method for manufacturing a semiconductor device including a step of sealing a semiconductor chip mounted on a wiring substrate.

In Japanese unexamined Patent Application publication No. 2005-100293, there is disclosed a semiconductor device in which a side surface of a wiring substrate on which a semiconductor chip is mounted is covered with a sealing resin. In Japanese unexamined Patent Application publication No. 2013-138263, there is disclosed a semiconductor device in which a plurality of wirings extends toward each side of a wiring substrate on the back surface of the wiring substrate.

SUMMARY OF THE INVENTION

There is a semiconductor device in which a semiconductor chip mounted on a wiring substrate is sealed with a resin. In a wiring substrate used in a method of manufacturing a resin-sealed semiconductor device, an outer frame region exists around a region to be finally a product. The outer frame region is used for alignment or the like during the manufacturing process. In order to improve the manufacturing efficiency of the semiconductor device, it is preferable to increase the number of products that can be obtained from one wiring substrate. Therefore, it is preferable to make the area of the outer frame region as small as possible.

Other objects and novel features will become apparent from the description of this specification and the accompanying drawings.

A method of manufacturing a semiconductor device according to an embodiment includes a sealing step of sealing a semiconductor chip mounted on a wiring substrate. The wiring board includes a first main surface on which the semiconductor chip is mounted, and a second main surface on the opposite side of the first main surface. The sealing step includes a step of disposing the wiring substrate between a first type and a second type, suctioning the second main surface of the wiring substrate with a plurality of adsorption holes, whereby the first type holds the wiring substrate, and a step of sealing the semiconductor chip, the first main surface of the wiring substrate, and the plurality of side surfaces of the wiring substrate such that each of the semiconductor chip, the first main surface of the wiring substrate, and the plurality of side surfaces of the wiring substrate is covered with the resin in the second type.

According to the above embodiment, the manufacturing efficiency of the semiconductor device can be improved.

DESCRIPTIONS OF THE PREFERRED EMBODIMENTS

Figure 1:
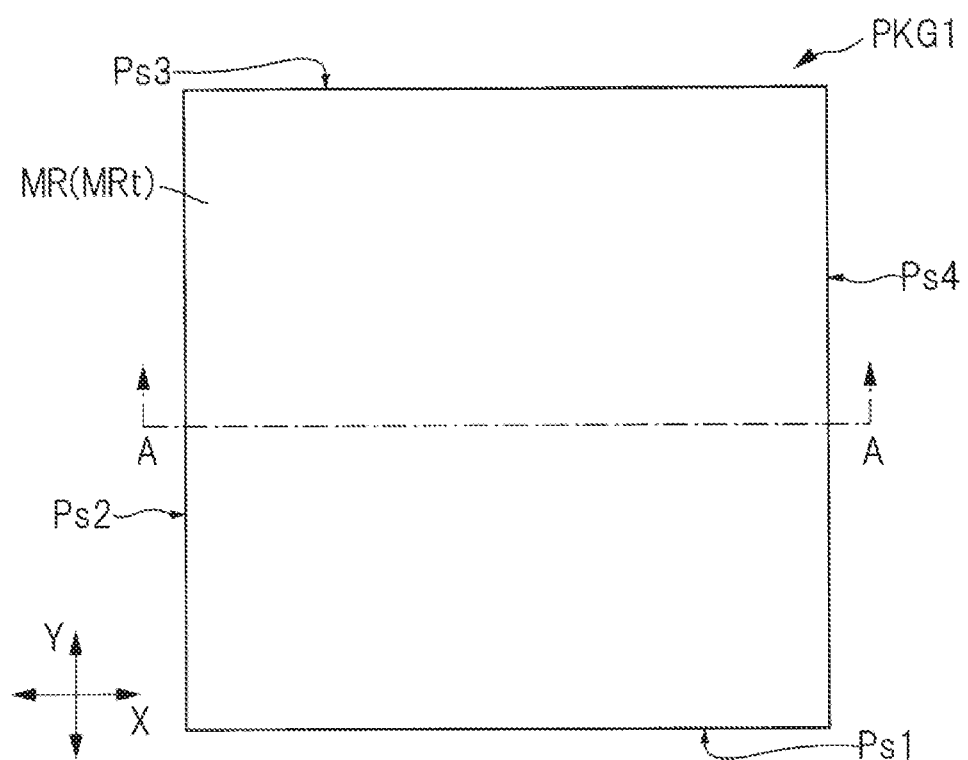
FIG. 1 is a top view of a semiconductor device according to an embodiment.

In the present application, descriptions of embodiments will be divided into a plurality of sections or the like for convenience of description, if necessary, except where expressly stated otherwise, these are not independent from each other, and each part of a single example, one of which is a partial detail or a part or all of the other, whether before or after the description. In principle, descriptions of identification parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, a "silicon member" or the like is not limited to pure silicon, and it is needless to say that a member including a SiGe (silicon-germanium) alloy, a multi-element alloy containing silicon as its main component, other additives, or the like is also included. In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context. In the following description, a certain value and another value may be referred to as "the same" or "the identification", but the meaning of "the same" or "the same" includes strictly the same cases as well as cases in which there is an error within a range that can be considered to be substantially equivalent.

In the drawings of the embodiments, the same or identifical parts are denoted by the same or identical symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that it is not a void, even if it is not a cross-section, or to indicate the boundary of a region.

<Semiconductor Device>

Figure 2:
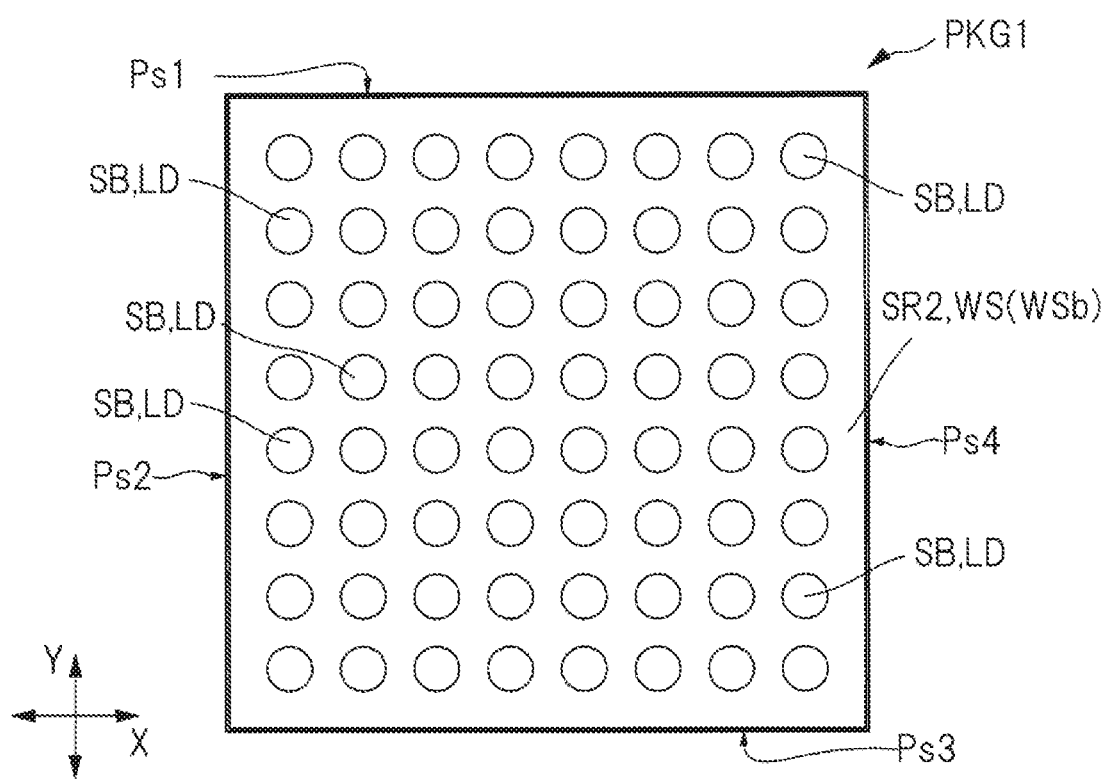
FIG. 2 is a bottom view showing the mounting surface side of the semiconductor device shown in FIG. 1.
Figure 3:
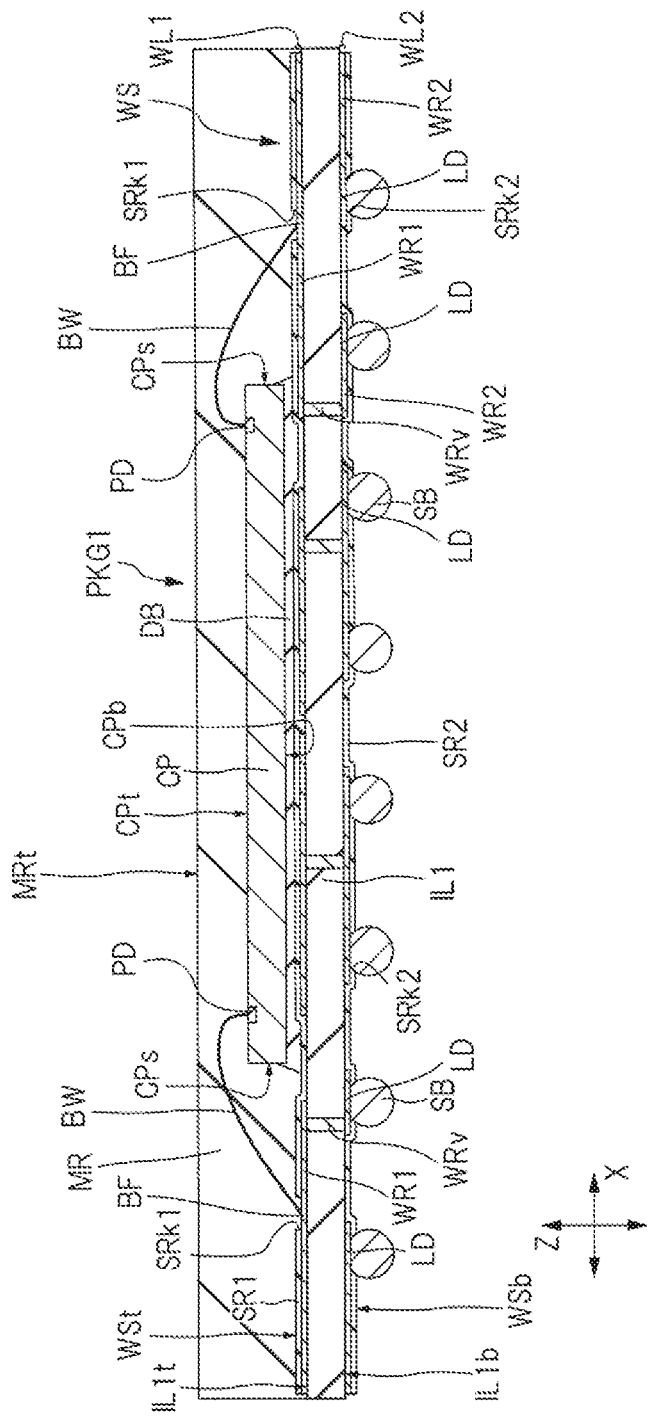
FIG. 3 is a cross-sectional view taken along line A-A of FIG. 1.
Figure 4:
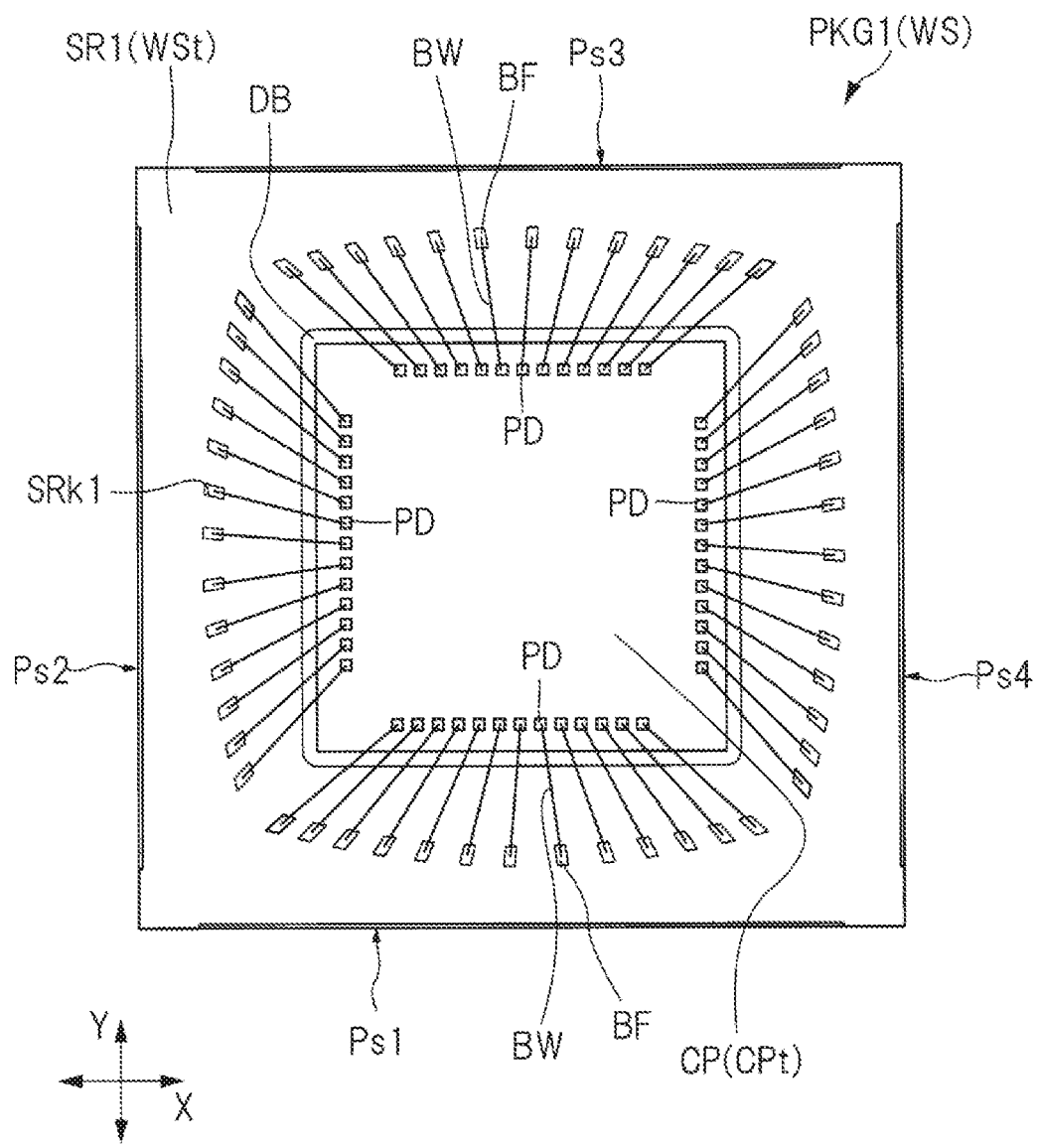
FIG. 4 is a perspective plan view showing the upper surface side of the wiring substrate with the sealing body shown in FIG. 1 removed.

First, a configuration example of a semiconductor device (semiconductor package) will be described with reference to FIGS. 1 to 4. FIG. 1 is a top view showing the chip mounting surface side of the semiconductor device of the present embodiment. FIG. 2 is a bottom view showing the mounting surface side of the semiconductor device shown in FIG. 1. FIG. 3 is a cross-sectional view taken along line A-A of FIG. 1. FIG. 4 is a perspective plan view showing the upper surface side of the wiring substrate with the sealing body shown in FIG. 1 removed.

As shown in FIGS. 1 and 2, the semiconductor device PKG1 has a rectangular shape in plan view. In FIGS. 1 and 2, an example in which the planar shape of the semiconductor device PKG1 is a square shape is illustrated, but a rectangular shape may be used, for example. As shown in FIG. 3, the semiconductor device PKG1 of the present embodiment includes a wiring substrate WS, a semiconductor chip CP mounted on the wiring substrate WS, and a sealing body MR for sealing the semiconductor chip CP. The semiconductor chip CP and the wiring substrate WS are connected via wires BW. The sealing body MR is formed on the upper surface WSt of the wiring substrate WS and covers the entire upper surface WSt. The sealing body MR covers the entire semiconductor chip CP and the plurality of wires BW.

As shown in FIG. 3, the wiring substrate WS includes an upper surface WSt and a lower surface WSb on the opposite side of the upper surface WSt. The wiring substrate WS includes an insulating layer IL1 as a base material, an insulating film (protective film, solder resist film) SR1 covering the upper surface (main surface, surface) IL1t of the insulating layer IL1, and an insulating film (protective film, solder resist film) SR2 covering the lower surface (main surface, surface) IL1b of the insulating layer IL1. The upper surface IL1t of the insulating layer IL1 is a surface opposed to the semiconductor chip CP, and the lower surface IL1b is a surface opposed to the upper surface IL1t of the semiconductor chip CP. The insulating layer IL1 is made of, for example, a prepreg in which a glass fiber is impregnated with a resin. The insulating films SR1 and SR2 are protective films for preventing short-circuiting between a plurality of wirings, disconnection, and the like. The insulating film SR1 is formed on the upper surface WSt which is the uppermost surface of the wiring substrate WS, and the insulating film SR2 is formed on the lower surface WSb which is the lowermost surface of the wiring substrate WS.

The wiring substrate WS is disposed on the upper surface IL1t side of the insulating layer IL1, and includes a wiring layer WL1 on which a plurality of conductive patterns is formed, and a wiring layer WL2 on which a plurality of conductive patterns is formed, which is disposed on the lower surface IL1b side of the insulating layer IL1. The conductive patterns formed on the interconnection layers WL1 include a plurality of terminals BFs. Each of the plurality of terminals BF is exposed from the insulating film SR1 on the upper surface WSt of the wiring substrate WS. An opening portion SRk1 is formed in the insulating film SR1, and the terminal BF is exposed from the insulating film SR1 in the opening SRk1. The conductive patterns formed on the wiring layers WL1 include a wiring WR1 connected to the terminals BFs. The wiring WR1 is covered with an insulating film SR1. The conductive patterns formed on the interconnection layers WL2 include a plurality of lands (terminals) LDs. Each of the plurality of lands LDs is exposed from the insulating film SR2 on the lower surface WSb of the wiring substrate WS. An opening portion SRk2 is formed in the insulating film SR2, and the land LD is exposed from the insulating film SR2 in the opening portion SRk2. The conductive patterns formed on the wiring layers WL2 include a wiring WR2 connected to the lands LDs. The wiring WR2 is covered with an insulating film SR2. The wiring WR1 and the wiring WR2 shown in FIG. 3 will be described later in detail.

The wiring substrate WS includes a plurality of via wirings WRv penetrating the insulating layers IL1 in the thickness direction (Z direction in FIG. 3). The via wirings WRv is an interlayer conductive path that electrically connects the wiring layer WL1 and the wiring layer WL2. The plurality of terminals BF and the plurality of lands LD are electrically connected via a plurality of via wirings WRv. The via wiring extends from one surface (e.g., the upper surface WSt) of the upper surface WSt and the lower surface WSb toward the other surface (e.g., the lower surface WSb).

A plurality of solder balls SB is connected to the plurality of lands LD. The lands LD and the solder balls SB are external electrodes (external connection terminals) for electrically connecting the semiconductor device PKG1 and the mounting board (motherboard). As shown in FIG. 2, the lands LD and the solder balls SB are arranged in a matrix on the lower surface WSb.

In the examples shown in FIG. 3, the wiring substrate WS is a wiring board including two wiring layers WL1 and WL2, but the number of wiring layers included in the wiring substrate WS may be three or more. For example, a build-up insulating layer made of resins may be disposed between the insulating layer IL1 and the insulating film SR1 and between the insulating layer IL1 and the insulating film SR2 shown in FIG. 3. Since two wiring layers can be disposed on the upper surface IL1t side and the lower surface IL1b side of the insulating layer IL1, a wiring board having four wiring layers in total can be obtained. When the number of wiring layers is increased, the space in which wiring is routed can be increased, which is effective when applied to a semiconductor device having a large number of terminals. On the other hand, if the number of wiring layers is reduced, the manufacturing process of the wiring substrate WS can be simplified, and thus the manufacturing efficiency can be improved. In the example shown in FIG. 2, a plurality of solder balls SB (a plurality of lands LD) is arranged at equal intervals. However, the arrangement of the plurality of solder balls SB (the plurality of lands LD) is not limited to the embodiment shown in FIG. 2. For example, the arrangement interval of some of the solder balls SB (lands LD) among the plurality of solder balls SB (lands LD) may be different from the arrangement interval of the other solder balls SB (lands LD).

Further, as shown in FIGS. 2 and 4, the upper surface WSt (see FIG. 4) and the lower surface WSb (see FIG. 4) of the wiring substrate WS form a square. A semiconductor chip CP is mounted on the upper surface WSt of the wiring substrate WS. As shown in FIG. 4, the semiconductor chip CP has a rectangular shape along the outer shape of the wiring substrate WS in plan view, and is disposed, for example, substantially at the center of the upper surface WSt. Around the semiconductor chip CP, a plurality of terminals (bonding leads and bonding pads) BF is formed on the upper surface WSt. The plurality of terminals BF is bonding pads for electrically connecting the wires BW and the wiring substrate WS, and are made of, for example, a metal such as copper (Cu). The plurality of terminals BF are arranged along each side of the semiconductor chip CP. In the example shown in FIG. 4, a plurality of terminals BF is arranged in one row along each side of the semiconductor chip CP. As a modification, a plurality of terminals BF may be arranged in a plurality of rows along each side of the semiconductor chip CP. In the embodiment shown in FIG. 4, an opening portion SRk1 is formed corresponding to each of the plurality of terminals BF, and the periphery of the terminal BF is covered with an insulating film SR1. However, as a modification, the opening portion SRk1 may be formed over a plurality of terminals BF. In this instance, a plurality of terminals BF is arranged in one opening portion SRk1, and the insulating layers IL1 (see FIG. 3) are exposed between adjacent terminals BF.

As shown in FIGS. 2 and 4, the upper surface WSt (see FIG. 4) and the lower surface WSb (see FIG. 4) of the wiring substrate WS have a side Ps1 extending in the X direction and a side Ps2 extending in the Y direction intersecting the X direction. The upper surface WSt and the lower surface WSb of the wiring substrate WS are opposite to each other in the side Ps1, and have a side Ps3 extending in the X direction and a side Ps4 extending in the Y direction, which are opposite to each other in the side Ps2.

Next, the semiconductor chip CP mounted on the wiring substrate WS will be described. As shown in FIG. 3, the semiconductor chip CP includes a front surface (main surface) CPt, a back surface (main surface) CPb on the opposite side of the front surface CPt, and a side surface CPs located between the front surface CPt and the back surface CPb. In addition, as shown in FIG. 4, the planar shape of the semiconductor chip CP, i.e., the shape of the front surface CPt and the back surface CPb, is a quadrangle. Although FIG. 4 illustrates an example in which the planar shape of the semiconductor chip CP is a square, for example, it may be a rectangle. A plurality of pads PD is formed on the front surface CPt of the semiconductor chip CP. The plurality of pads PD is arranged along each side of the semiconductor chip CP on the peripheral portion side on the surface CPt.

A plurality of semiconductor elements (circuit elements) such as diodes and transistors are formed between the front surface CPt and the back surface CPb of the semiconductor chip CP, and are electrically connected to the plurality of pads PD via wirings (wiring layers) (not shown) formed on the semiconductor elements. As described above, the semiconductor chip CP constitutes an integrated circuit by the plurality of semiconductor elements formed on the semiconductor substrate and the wiring electrically connecting the plurality of semiconductor elements.

The base material (semiconductor substrate) having the semiconductor element forming surface of the semiconductor chip CP is made of, for example, silicon (Si). In addition, a passivation film (not shown) as an insulating film is formed on the surface CPt as the outermost surface of the semiconductor chip CP, and the surface of each of the plurality of pads PD is exposed from the passivation film in the opening portion formed in the passivation film.

The pad PD is made of metal, and in the present embodiment, is made of aluminum (Al), for example. Further, a metal film such as a gold (Au) film or a laminated film thereof may be formed on the surface of the pad PD via a nickel (Ni) film, for example.

In the present embodiment, the semiconductor chip CP is mounted on the wiring substrate WS by a so-called face-up mounting method in which the back surface CPb and the upper surface WSt of the wiring substrate WS face each other. The semiconductor chip CP is fixed to the top surface WSt via the adhesive DB in the chip mounting region CPr (see FIG. 6, below) of the top surface. The adhesive DB is not particularly limited as long as it can securely fix the semiconductor chip CP to the upper surface WSt of the wiring substrate WS, but in the present embodiment, for example, a die bonding material containing an epoxy thermosetting resin is used.

As shown in FIGS. 3 and 4, the semiconductor chip CP is electrically connected to the wiring substrate WS via a plurality of wires BW. More specifically, one end of the wire BW is connected to the pad PD on the surface CPt of the semiconductor chip CP, and the other end is connected to the terminal BF of the wiring substrate WS. The wire BW is made of a metal material such as gold (Au) or copper (Cu), for example.

Next, a sealing body MR for sealing the semiconductor chip CP, the plurality of wires BW, and the plurality of terminals BF shown in FIG. 3 will be described. As shown in FIG. 1, the upper surface MRt of the sealing body MR has a rectangular shape. As will be described in detail later, the semiconductor device PKG1 is manufactured by a method in which a sealing body is formed so as to cover a plurality of device regions collectively, and then the sealing body and the wiring substrate are cut collectively. In the case of this method, the side surface of the sealing body MR and the side surface of the wiring substrate WS are formed so as to be continuous. In other words, the side surface of the sealing body MR and the side surface of the wiring substrate WS overlap each other in the thickness direction of the semiconductor device PKG1. In other words, as shown in FIG. 1, each of the upper surface MRt of the sealing body MR and the upper surface WSt of the wiring substrate WS (see FIG. 4) has a side Ps1 extending in the X direction, a side Ps2 extending in the Y direction crossing the X direction, a side Ps3 extending in the X direction and on the opposite side of the side Ps1, and a side Ps4 extending in the Y direction and on the opposite side of the side Ps2.

The sealing body MR is an insulating resin body having a large number of filler particles as a main component, for example, a thermosetting resin such as an epoxy resin, a curing agent, and silica. Carbon particles are mixed into the sealing body MR as a colorant. As shown in FIG. 3, the sealing body MR is cured in a state in which it is in close contact with the semiconductor chip CP and the plurality of wires BW arranged inside the package. That is, the sealing body MR has a function of protecting the semiconductor chip CP and the plurality of wires BW.

<Method of Manufacturing the Semiconductor Device>

Figure 5:
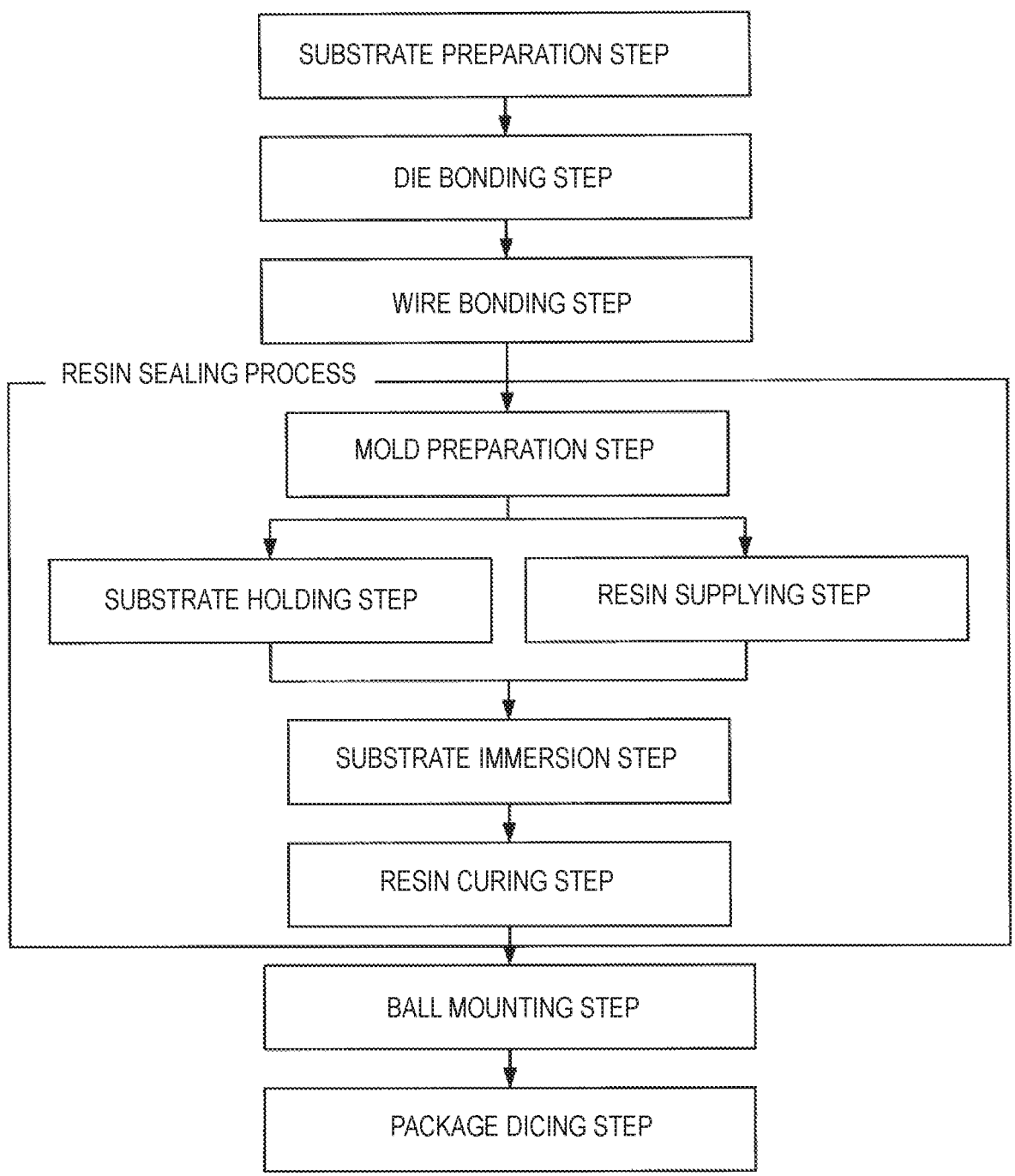
FIG. 5 is an explanatory view showing a flow of an assembling process of the semiconductor device described with reference to FIGS. 1 to 4.

Next, a method of manufacturing the semiconductor device PKG1 described with reference to FIGS. 1 to 4 will be described with reference to a flowchart shown in FIG. 5. FIG. 5 is an explanatory view showing a flow of an assembling process of the semiconductor device described with reference to FIGS. 1 to 4.

<Substrate Preparation Step>

Figure 6:
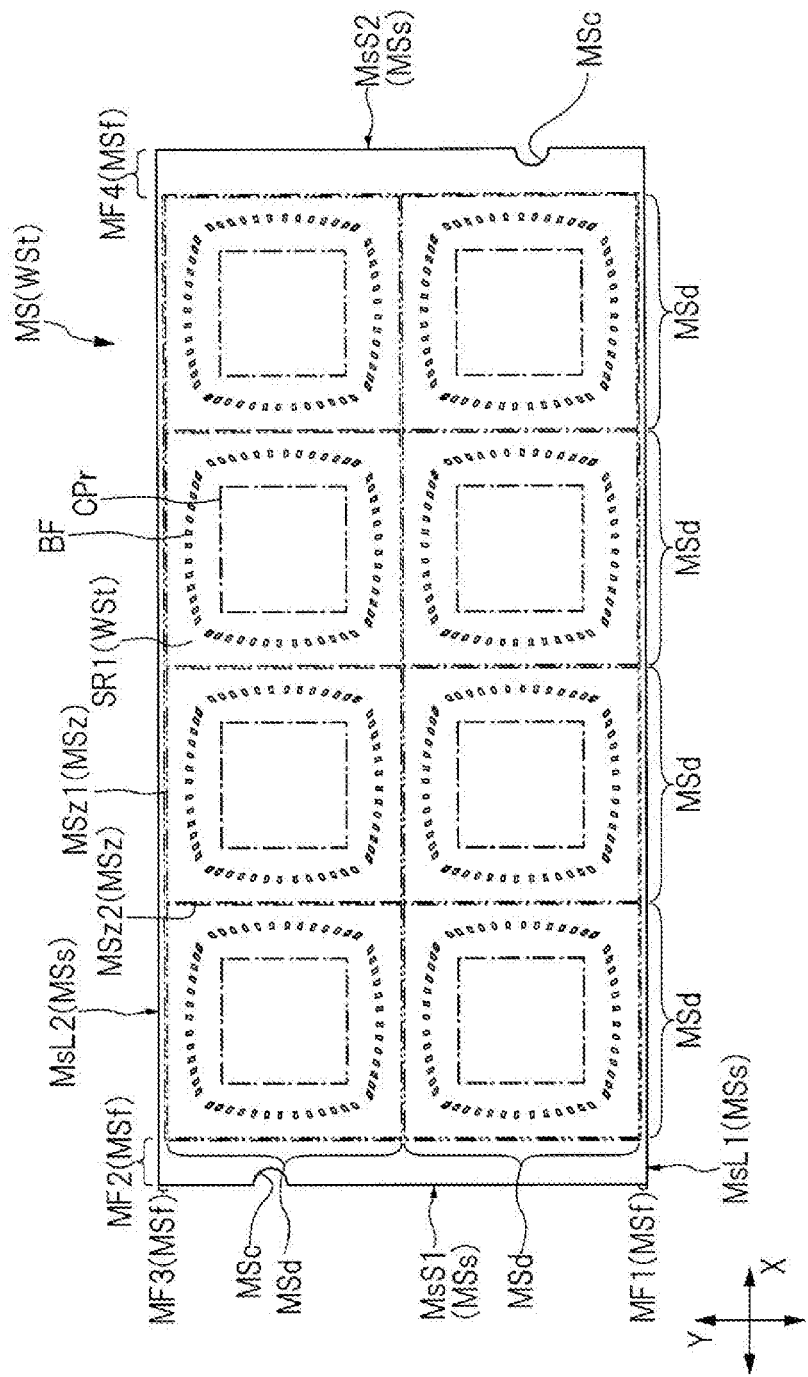
FIG. 6 is a plan view showing the overall structure of a wiring substrate prepared in the substrate preparation step shown in FIG. 5.

First, as a substrate preparation step shown in FIG. 5, a wiring substrate MS as shown in FIG. 6 is prepared. FIG. 6 is a plan view showing the overall structure of the wiring substrate prepared in the substrate preparation step shown in FIG. 5, and FIG. 7 is an enlarged plan view showing the back surface side of the wiring substrate shown in FIG. 6.

As shown in FIG. 6, the wiring substrate MS prepared in this step includes a plurality of device regions MSd inside an outer frame (frame portion) MSf. The number of the device regions MSd is not limited to the mode shown in FIG. 6, but the wiring substrate MS of the present embodiment includes, for example, eight device regions MSd. The wiring substrate MS is a so-called multi-chip substrate having a plurality of device regions MSd.

Each device region MSd corresponds to the wiring substrate WS shown in FIG. 4. The device region MSd includes a top surface WSt and a lower surface surface WSb (see FIG. 7) on the opposite side of the top surface WSt. In the device region MSd, the respective members of the wiring substrate WS described with reference to FIGS. 2 to 4 are formed. As shown in FIG. 6, the device region MSd of the circuit board MS includes a plurality of terminals BFs exposed from the insulating film SR1 on the upper surface WSt of the device region MSd. The plurality of terminals BF are arranged so as to surround the periphery of the chip mounting region CPr. The chip mounting region CPr is a region where the semiconductor chip CP shown in FIG. 4 is to be mounted. As shown in FIG. 7, the device region MSd of the circuit board MS includes a plurality of lands LD exposed from the insulating film SR2 on the lower surface WSb of the device region MSd. The plurality of lands LD are arranged in a matrix in plan view. The solder ball SB shown in FIG. 4 is bonded to the land LD in the ball mounting step shown in FIG. 5. Therefore, at the time of the substrate preparation step, the solder ball SB is not bonded to the land LD.

Figure 7:
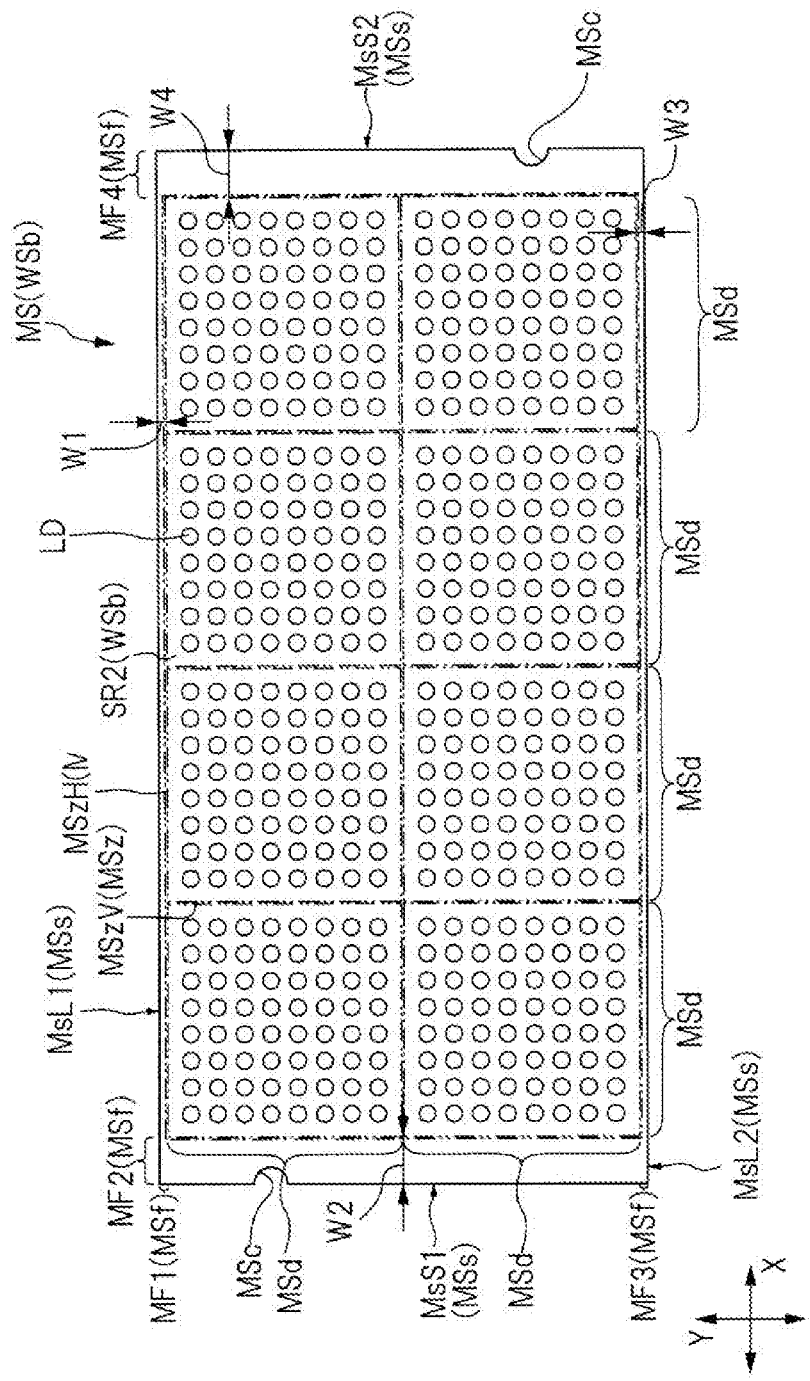
FIG. 7 is an enlarged plan view showing the back surface side of the wiring board of FIG. 6.

As shown in FIGS. 6 and 7, a cutting region (cutting line) MSz is disposed around each of the plurality of device regions MSd. The cutting region MSz is disposed between adjacent device regions MSd and between the outer frame MSf and the device region MSd so as to surround the outer edge of each device region MSd. The cutting region MSz is a region where the wiring substrate MS is to be cut in the package dicing step shown in FIG. 5. The cutting area MSz includes a plurality of cutting lines MSzH extending along the X direction and a plurality of cutting lines MSzV extending along the Y direction. In plan view, the cutting line MSzH and the cutting line MSzV intersect. In the package dicing step, the wiring substrate MS is cut by cutting the cutting region MSz of the wiring substrate MS using a cutting jig called a dicing blade. Therefore, the cutting region MSz has a width of about several hundred μm in a direction intersecting with the extending direction.

As shown in FIGS. 6 and 7, the wiring substrate MS includes a plurality of side surfaces MSs connected to the upper surface WSt (see FIG. 6) and the lower surface WSb (see FIG. 7). In plan view, the wiring substrate MS includes a long side MsL1 extending in the X direction, a long side MsL2 on the opposite side of the long side MsL1, a short side MsS1 extending in the Y direction crossing the X direction (perpendicular in FIGS. 6 and 7), and a short side MsS2 on the opposite side of the short side MsS1. The outer frame MSf includes an outer frame region MF1 between the long side MsL1 and the plurality of device regions MSd, an outer frame region MF2 between the short side MsS1 and the plurality of device regions MSd, an outer frame region MF3 between the long side MsL2 and the plurality of device regions MSd, and an outer frame region MF4 between the short side MsS2 and the plurality of device regions MSd.

As shown in FIG. 7, the width W1 in the Y direction of the outer frame region MF1 extending in the X direction and the width W3 in the Y direction of the outer frame region MF3 are narrower than the width W2 in the X direction of the outer frame region MF2 extending in the Y direction and the width W4 in the X direction of the outer frame region MF4. In the manufacturing process of the wiring substrate MS, a panel substrate (not shown) having a plane area larger than the plane area of the wiring substrate MS is prepared and a plurality of wiring substrates MS is obtained from one panel substrate from the viewpoint of improving the manufacturing efficiency. As the number of wiring substrates MS that can be obtained from one panel substrate increases, the manufacturing efficiency of the wiring substrate MS can be improved, and as a result, the manufacturing efficiency of the semiconductor device PKG1 shown in FIG. 1 can be improved. When the widths W1 and W3 of the outer frame regions MF1 and MF3 arranged along the long sides MsL1 and MsL2 are small as in the case of the wiring substrate MS shown in FIG. 7, the number of the wiring substrate MS that can be obtained from the one panel board can be increased.

As shown in FIG. 7, each of the short side MsS1 and the short side MsS2 has a concave portion MSc recessed toward the plurality of device regions MSd in plan view. The concave portion MSc is a groove formed on the side surface of the wiring substrate MS, and is used to align the wiring substrate MS with a mold for sealing at least in the resin sealing process shown in FIG. 5. When the wiring substrate has a wide width W1 of the outer frame region MF1 and a wide width W3 of the outer frame region MF3, through holes (slits) for alignment can be formed in the outer frame region MF1 and the outer frame region MF3, respectively. When the through holes for alignment are arranged along the long side, the alignment accuracy between the sealing mold and the wiring substrate is improved.

However, since the width W1 of the outer frame region MF1 and the width W3 of the outer frame region MF3 are narrow in the wiring substrate MS of the present embodiment, the through holes (slits) for alignment cannot be formed in the outer frame region MF1 and the outer frame region MF3, respectively. As shown in FIGS. 6 and 7, each of the long side MsL1 and the long side MsL2 has no concave portion MSc recessed toward the plurality of device regions MSd in plan view. Although the detail will be described later, in the present embodiment, by devising the method of forming the sealing member in the resin sealing process, a manufacturing method is realized in which the through-holes (slits) for alignment need not be formed in the outer frame region MF1 and the outer frame region MF3, respectively.

Figure 12:
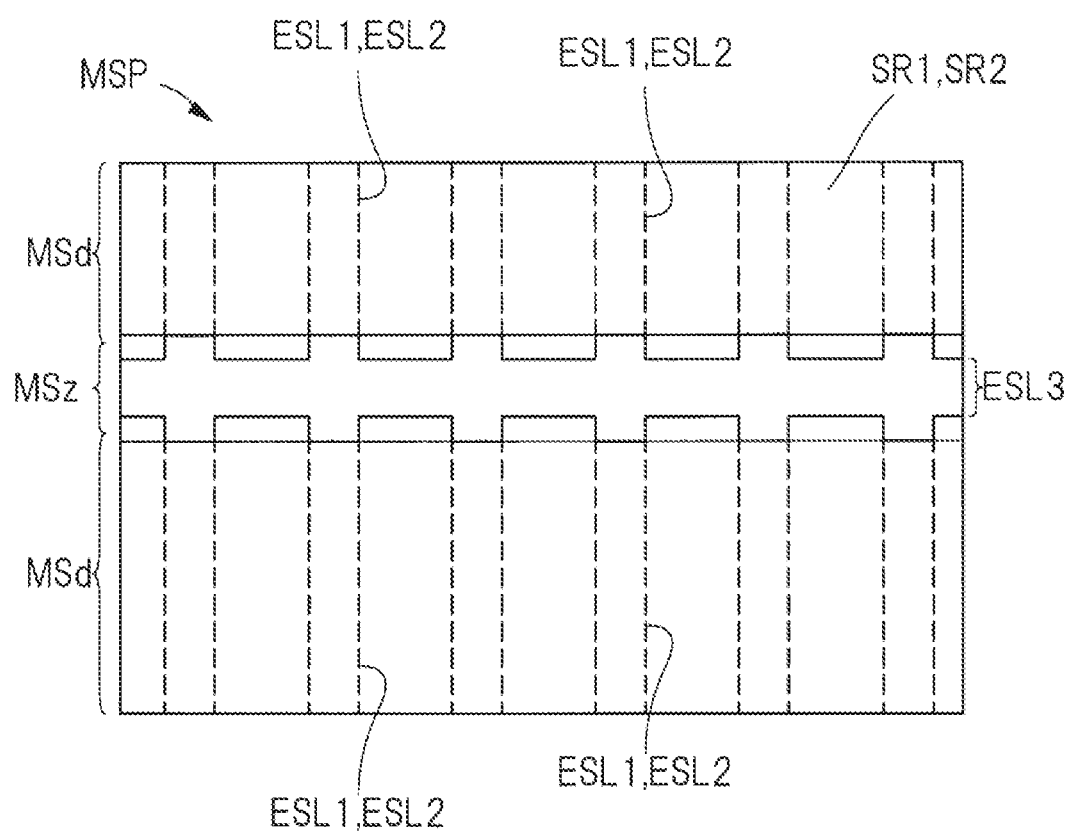
FIG. 12 is an enlarged plan view of the periphery of the cutting region in the opening portion forming step shown in FIG. 11.
Figure 13:
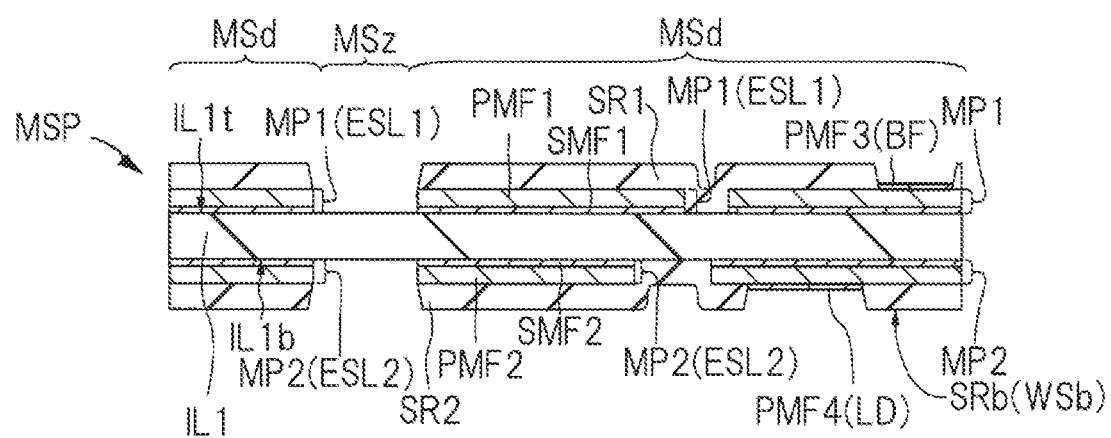
FIG. 13 is an enlarged cross-sectional view showing a conductive pattern removing step of removing a conductive pattern exposed from the insulating film shown in FIG. 11.
Figure 14:
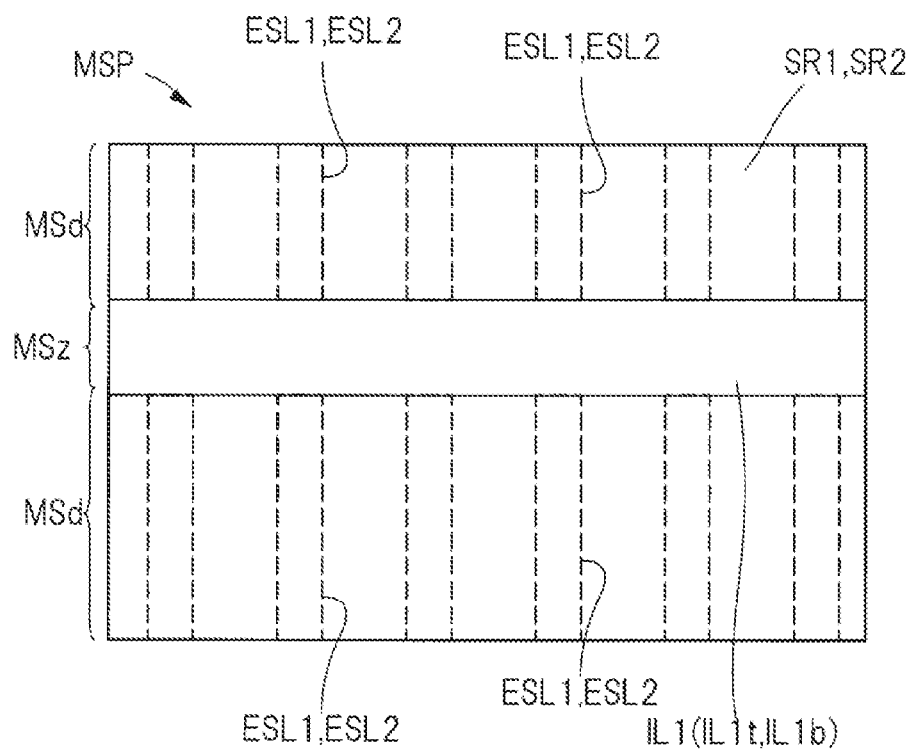
FIG. 14 is an enlarged plan view of the same position as FIG. 12 in the conductive pattern removing step shown in FIG. 13.

The wiring substrate MS is manufactured, for example, as follows. FIGS. 8 to 14 are explanatory diagrams schematically showing the manufacturing process of the wiring substrate MS shown in FIGS. 6 and 7. FIG. 12 is an enlarged plan view of the periphery of the cutting region in the opening portion forming step shown in FIG. 11. FIG. 14 is an enlarged plan view of the same position as FIG. 12 in the conductive pattern removing step shown in FIG. 13. In the positions shown in FIGS. 12 and 14, the upper surface IL1t side and the lower surface IL1b side of the insulating layers IL1 shown in FIGS. 11 and 13 have the same structures. For this reason, FIGS. 12 and 14 are enlarged plan views of the upper surface IL1t side and the lower surface IL1b side. In FIG. 12 and FIG. 14, portions of the feeder lines ESL1 and ESL2 covered with the insulating films SR1 and SR2 are indicated by dotted lines.

Figure 8:
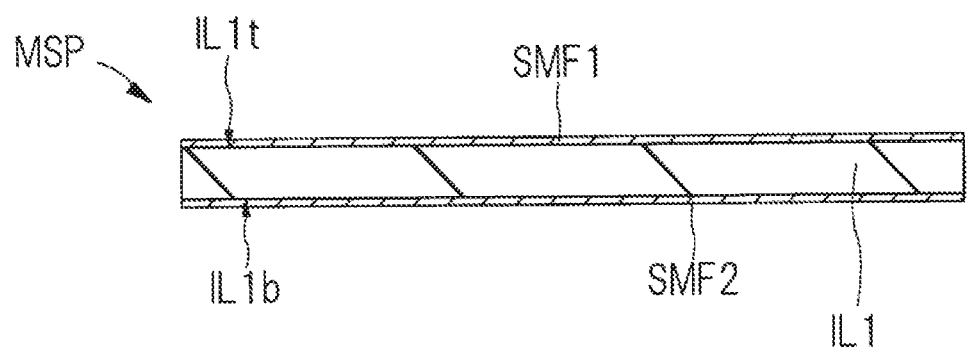
FIG. 8 is an enlarged cross-sectional view of a panel substrate illustrating a manufacturing process of the wiring substrate shown in FIGS. 6 and 7.

The substrate preparation step shown in FIG. 5 includes a panel substrate preparation step for preparing the panel wiring substrate MSP shown in FIG. 8. The panel wiring substrate MSP includes an insulating-layer IL1 which is a base material of the panel wiring substrate MSP. The insulating layer IL1 has an upper surface (main surface, surface) IL1t and a lower surface (main surface, surface) IL1b opposed to the upper surface IL1t. The panel wiring substrate MSP includes a metal film SMF1 covering the upper surface IL1t of the insulating layer IL1 and a metal film SMF2 covering the lower surface IL1b of the panel wiring substrate MSP. The metal films SMF1 and SMF2 are metal thin films such as copper foil, for example.

The substrate preparation step shown in FIG. 5 includes a through hole forming step of forming a through hole penetrating the insulating layers IL1 to form the via wirings WRv shown in FIG. 4 after the substrate preparation step. In the through-hole forming step, a through-hole penetrating from one of the upper surface IL1t and the lower surface IL1b of the insulating IL1 shown in FIG. 8 to the other is formed. At this time, portions of the metal film SMF1 formed on the upper surface IL1t of the insulating layer IL1 and the metal film SMF2 formed on the upper surface IL1b of the insulating layer IL1 that overlap with the through holes are removed. After the through-holes are formed, residual smears remaining around the through-holes are removed when the through-holes are formed.

The substrate preparation step illustrated in FIG. 5 includes a metal film deposition step in which a metal film PMF1 and a PMF2 (see FIG. 9) are deposited on the metal film SMF1 and the SMF2 after the through-hole forming step. In the metal film depositing step, the metal films PMF1 and PMF2 are deposited by electroplating using the metal films SMF1 and SMF2 as seed layers. The metal film PMF1 is formed on the metal film SMF1, and the metal film PMF2 is formed on the metal film SMF2. In the metal film depositing step, the metal films PMF1 and PMF2 are formed by depositing a metal film by, for example, an electroless plating method, and then depositing a metal film by an electrolytic plating method. By combining the electroless plating method and the electrolytic plating method in this manner, the metallic film can be buried in the through-hole penetrating the insulating-layer IL1. In this process, metal is buried in the through-hole formed in the through-hole forming step, and the via wiring WRv shown in FIG. 3 is formed. Depending on the hole diameter of the through hole, there may be a so-called through-hole wiring in which a metal film is formed along the side wall of the through hole without burying metal in the entire inside of the through hole.

Figure 9:
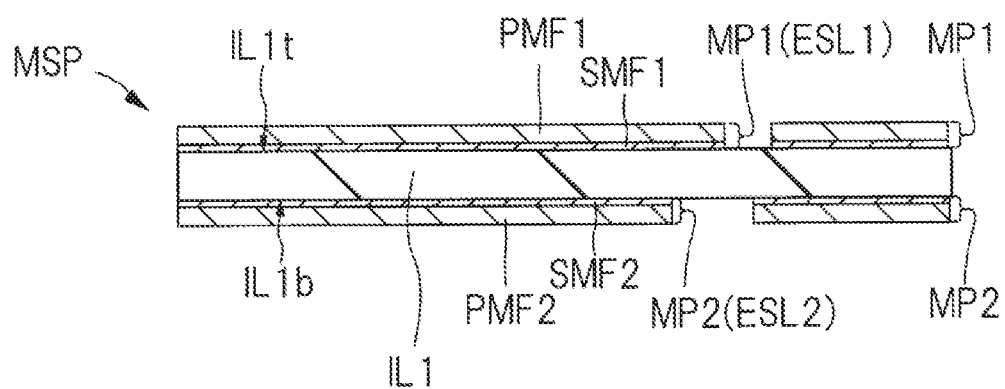
FIG. 9 is enlarged cross-sectional view showing a patterning step of depositing a metal film on a panel substrate and then patterning the metal film, illustrating a manufacturing step of the wiring substrate shown in FIGS. 6 and 7.

The substrate preparation step shown in FIG. 5 includes a patterning step of patterning the metallic film SMF1, the SMF2, the PMF1, and the PMF2 after the substrate preparation step. In the patterning step, after covering the metal film PMF1 and the metal film PMF2 with a resist film (not shown), the resist film is patterned by photolithography. Thereafter, etching is performed using the resist film as a mask. This etch process removes portions of the metallic film SMF1, the metallic film SMF2, the PMF1, and the PMF2 that are exposed from the resist film, and a plurality of conductive patterns MP1 and MP2 separated from each other are obtained as shown in FIG. 9.

Figure 10:
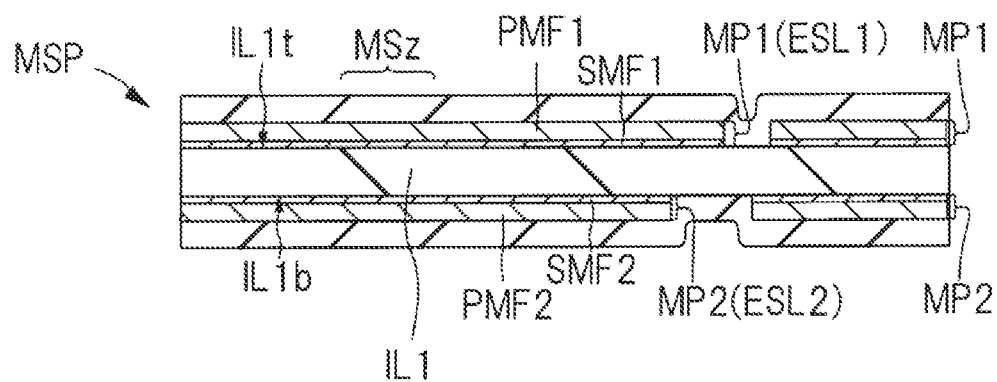
FIG. 10 is an enlarged cross-sectional view showing a step of forming an insulating film on the conductive pattern shown in FIG. 9.

The substrate preparing step shown in FIG. 5 includes an insulating film forming step of forming insulating films SR1 and SR2 so as to cover the upper surface IL1t and the lower surface IL1b of the insulating layers IL1, respectively, after the metallic film depositing step, as shown in FIG. 10. In the insulating film forming step, an insulating film SR1 is formed on the upper surface IL1t of the insulating film IL1. The plurality of conductive patterns MP1 are entirely covered with an insulating film SR1. Similarly, in the insulating film forming step, an insulating film SR2 is formed on the lower surface IL1b of the insulating film IL1. The plurality of conductive patterns MP2 are entirely covered with an insulating film SR2.

The substrate preparation step shown in FIG. 5 includes an opening portion forming step in which a part of the insulating films SR1 and SR2 is removed after the insulating film forming step to form an opening portion. In the opening portion forming step, the opening portion SRk1 shown in FIG. 3 is formed, and the terminal BF is exposed from the insulating film SR1 in the opening portion SRk1. In the opening forming step, the opening portion SRk2 shown in FIG. 3 is formed, and the land LD is exposed from the insulating film SR2 in the opening portion SRk2. In addition, in the opening portion forming step, the insulating film SR1 and the insulating film SR2 in a part of the cutting area MSz are removed.

Figure 11:
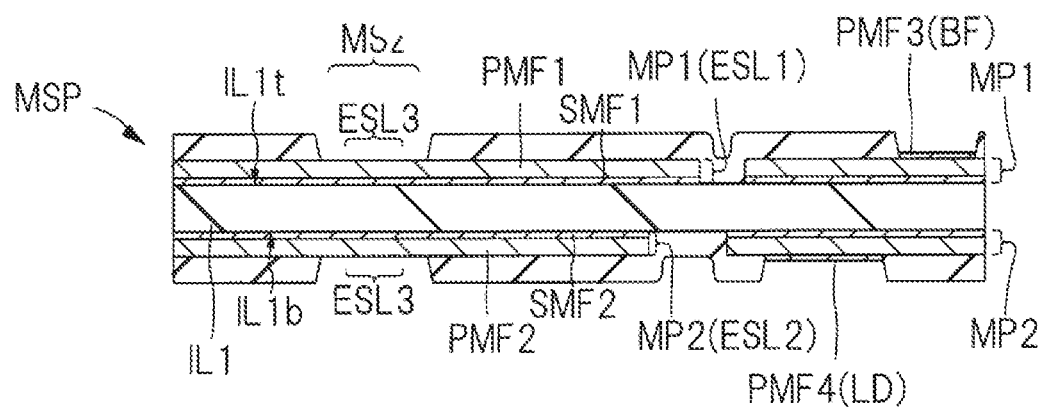
FIG. 11 is an enlarged cross-sectional view showing an opening portion forming step for removing a part of the insulating film shown in FIG. 10.

The substrate preparation step shown in FIG. 5 includes a plating step of forming the metallic films PMF3 and PFM4 shown in FIG. 11 on portions of the conductive patterns MP1 and MP2 exposed from the insulating films SR1 and SR2 after the opening portion forming step. In the plating step, a metal film PMF3 is formed on the metal film PMF1, and a metal film PMF4 is formed on the metal film PMF2. The metal film PMF3 and the metal film PFM4 are, for example, laminated films of a nickel (Ni) film and a gold (Au) film. However, there are various modified examples of materials constituting the metal film PMF3 and the metal film PFM4. The metal film PMF3 and the metal film PFM4 are formed by electroplating.

In the electrolytic plating method, the metal films PMF3 and PMF4 can be selectively deposited on the patterned metal films PMF1 and PMF2 by performing the plating step while supplying electricity to the seed layer. The plurality of conductive pattern MP1 includes a plurality of terminals BF shown in FIG. 4 and a plurality of wiring WR1 connected to a plurality of terminals BF (see FIG. 3). The plurality of wiring WR1 includes a feeder line ESL1 (see FIG. 9) for passing current to the seed layer in the metal film deposition step. The plurality of conductive pattern MP2 includes a plurality of land LDs shown in FIG. 2 and a plurality of wirings WR2 connected to a plurality of terminals BF (see FIG. 3). The plurality of wirings WR2 includes a feeder line ESL2 (see FIG. 9) for passing current to the seed layer in the metal film deposition step.

As shown in FIG. 12, in the cutting area MSz, connecting wires ESL3 for connecting the plurality of feeder lines ESL1 and ESL2 to each other are formed. By connecting the plurality of feeder lines ESL1 or the plurality of feeder lines ESL2 to each other via the connecting wire ESL3, the supplied current can be stabilized in the metallic film depositing step.

In the opening portion forming step described above, when the insulating films SR1 and SR2 in the cutting regions MSz are removed, the connecting wires ESL3 are exposed from the insulating films SR1 and SR2. Therefore, in order to prevent the metallic films PMF3 and PMF4 shown in FIG. 11 from being formed on the connecting wire ESL3 in the plating step, the connecting wire ESL3 is covered with a resist film (plating mask) (not shown). By covering the connecting wire ESL3 with the resist film, the metal films PMF3 and PMF4 shown in FIG. 11 are not formed in the connecting wire ESL3 shown in FIG. 12.

In the package dicing step shown in FIG. 5, the wiring substrate MS (see FIG. 6) is cut using a cutting jig called a dicing blade. At this time, when a conductive pattern such as a wire (metal pattern) is arranged in the cutting region MSz, there may be a fear of short-circuiting of the wire due to generation of cutting chips of the metal. Therefore, it is preferable that the conductive pattern arranged in the cutting region MSz is removed in advance before the package dicing step shown in FIG. 5. In the case of the present embodiment, the substrate preparation step shown in FIG. 5 includes a conductive pattern removal step of removing the conductive pattern disposed in the cutting region MSz after the plating step, as shown in FIGS. 13 and 14. In the manufacturing process of removing the conductive patterns, portions of the connecting wires ESL3 and the plurality of feeder lines ESL1 and ESL2 shown in FIGS. 11 and 12, which are disposed at positions overlapping with the cutting regions MSz, are removed. In the present embodiment, as described above, the metallic films PMF3 and PMF4 shown in FIG. 11 are not formed in the connecting wire ESL3 shown in FIG. 12. Therefore, in the manufacturing process of removing the conductive patterns, the metallic films SMF1, the SMF2, the PMF1, and the PMF2 (see FIG. 11) such as the connecting wires ESL3 are removed. As shown in FIG. 14, when this process is completed, each of the plurality of feeder lines ESL1 and the plurality of feeder lines ESL2 is electrically separated from each other. As shown in FIG. 13, the ends of the plurality of feeder lines ESL1 and the plurality of feeder lines ESL2 are exposed from the insulating films SR1 and SR2 at the outer edges of the device region MSd (see FIG. 14). The plurality of feeder lines ESL1 and the plurality of feeder lines ESL2 will be described in more detail when the resin sealing process is described.

The substrate preparation step shown in FIG. 5 includes a panel cutting step of cutting the panel wiring substrate MSP after the conductive pattern removing step to obtain the wiring substrate MS shown in FIGS. 6 and 7. In the panel cutting step, the panel wiring substrate MSP (see FIG. 13) is cut along the long sides MsL1 and MsL2 shown in FIGS. 6 and 7. In this step, a plurality of wiring substrates MS is obtained from one panel wiring substrate MSP.

Note that the concave portion MSc shown in FIGS. 6 and 7 can be performed at an arbitrary timing of the substrate preparation step shown in FIG. 5. For example, it may be formed in advance before the panel substrate preparation step. Alternatively, it may be performed at any timing from the panel substrate preparation step to the panel cutting step. There is also a method of forming the concave portion MSc after the panel cutting step. However, from the viewpoint of efficiently forming the concave portion MSc, it is preferable to form the concave portion MSc before the panel cutting step. In the panel cutting step, as in the package dicing step described later, a method of cutting a panel substrate using a rotating cutting jig called a router can be applied in addition to a method of cutting using a dicing blade. The router is a rod-shaped member having a blade at its outer periphery, and cuts a workpiece by moving the center of the rod while rotating the center of the rod. The recess MSc shown in FIGS. 6 and 7 may be formed by a jig such as a drill, for example, or may be formed by a router. When the formation of the concave portion MSc and the cutting of the panel substrate are performed by the router, respectively, the efficiency of the manufacturing process can be improved by forming the concave portion MSc at the time of the panel cutting step.

<Die Bonding Step>

Figure 15:
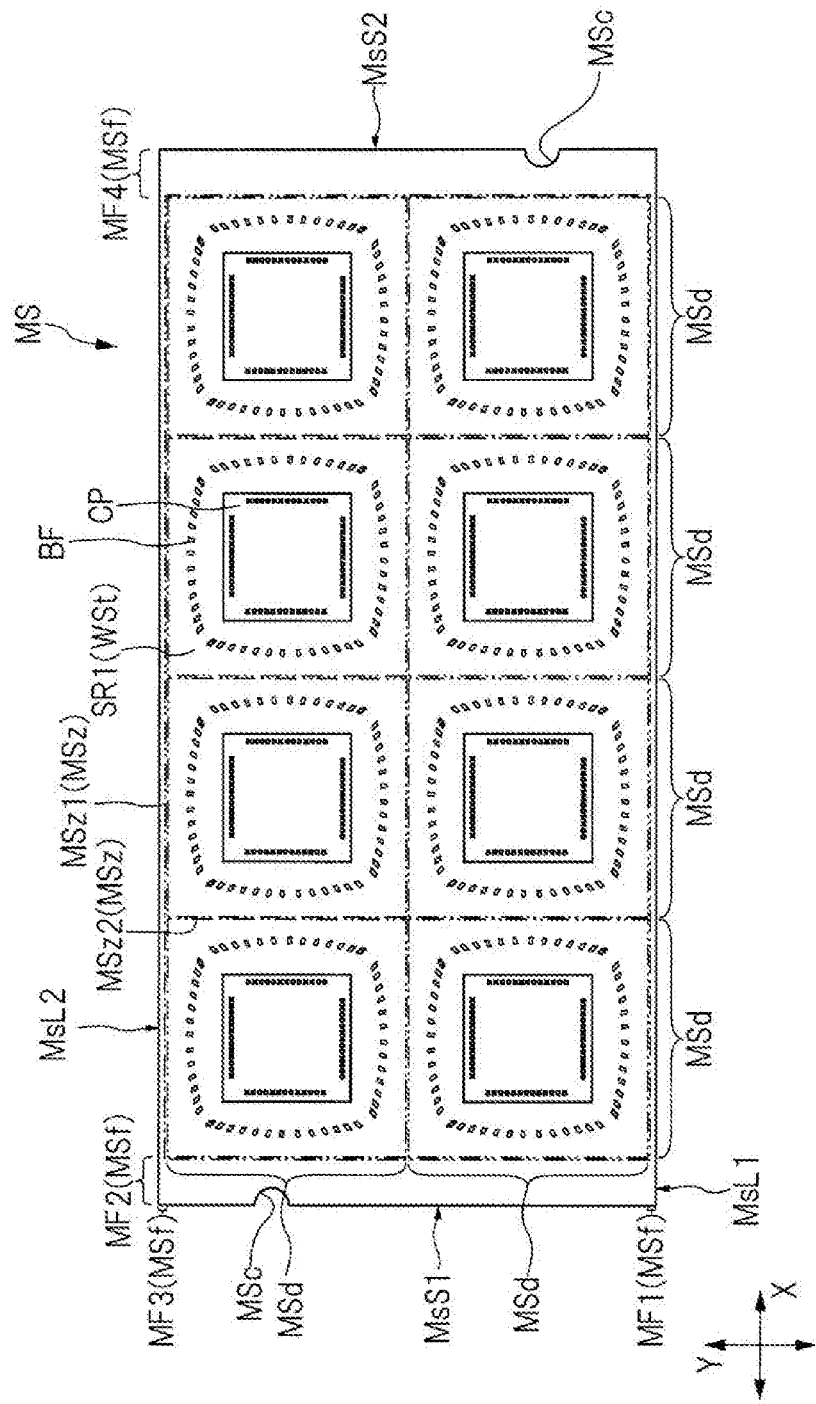
FIG. 15 is a plan view showing a state in which a semiconductor chip is mounted on the wiring substrate shown in FIG. 6.

Next, as a die bonding step shown in FIG. 5, a semiconductor chip CP is mounted on the upper surface WSt of the device region MSd of the wiring substrate MS as shown in FIG. 15. FIG. 15 is a plan view showing a state in which a semiconductor chip is mounted on the wiring substrate shown in FIG. 6. In FIG. 15, the adhesive DB shown in FIGS. 3 and 4 is omitted for the sake of clarity. However, in each of the plurality of device regions MSd shown in FIG. 15, as shown in FIG. 4, the adhesive DB is disposed around the semiconductor chip CP.

In the die bonding step, the semiconductor chip CP is mounted on each of the plurality of device regions MSd. The semiconductor chip CP is bonded and fixed onto the chip mounting region CPr shown in FIG. 6 via an adhesive DB. In the present embodiment, the semiconductor chip CP is mounted on the wiring substrate MS by a so-called face-up mounting method in which the back surface CPb (see FIG. 3) and the upper surface WSt of the wiring substrate MS face each other. The adhesive DB includes, for example, an epoxy-based thermosetting resin. In this case, in the die bonding step, first, the adhesive DB is applied onto the chip mounting region CPr, and then the back surface CPb of the semiconductor chip CP is pressed toward the chip mounting region CPr. As a result, the adhesive DB spreads over the chip mounting region CPr. The semiconductor chip CP is bonded onto the wiring substrate MS via an adhesive DB. Thereafter, heat treatment is performed to cure the thermosetting component included in the adhesive DB, whereby the semiconductor chip CP can be fixed on the wiring substrate MS.

<Wire Bonding Step>

Figure 16:
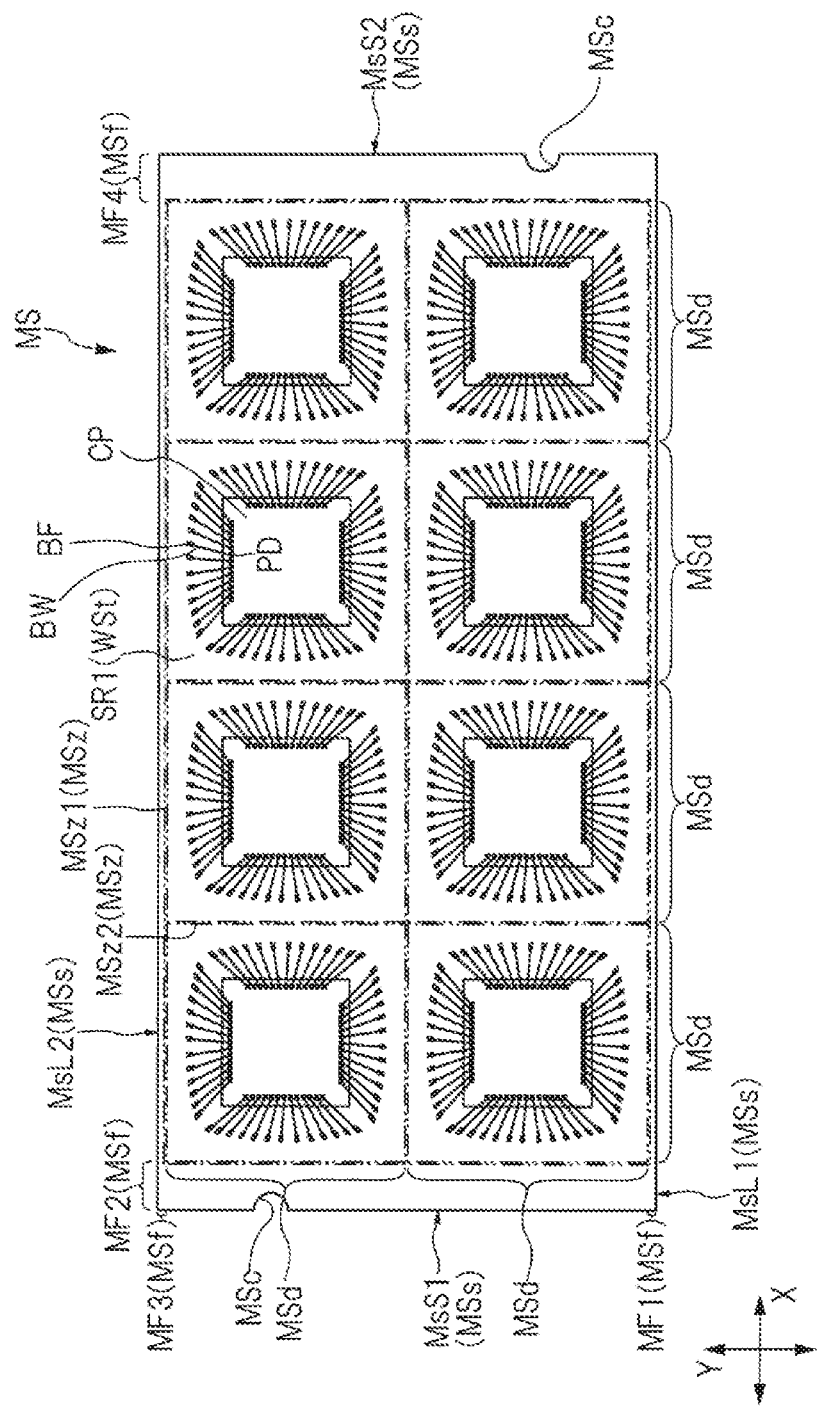
FIG. 16 is a plan view showing a state in which the semiconductor chip on the wiring substrate shown in FIG. 15 and the wiring substrate are electrically connected via wires.

Next, as a die bonding step shown in FIG. 5, as shown in FIG. 16, the semiconductor chip CP and the device region MSd of the wiring substrate MS are electrically connected to each other. FIG. 16 is a plan view showing a state in which the semiconductor chip on the wiring substrate shown in FIG. 15 and the wiring substrate are electrically connected via wires.

In the wire bonding step, the semiconductor chip CP and the device region MSd of the wiring substrate MS are electrically connected to each other via the wire BW. Specifically, as shown in FIG. 3, one end of the wire BW is connected to the pad PD on the surface CPt of the semiconductor chip CP, and the other end is connected to the terminal BF on the top surface WSt of the wiring substrate MS (see FIG. 16).

<Sealing Process>

Figure 17:
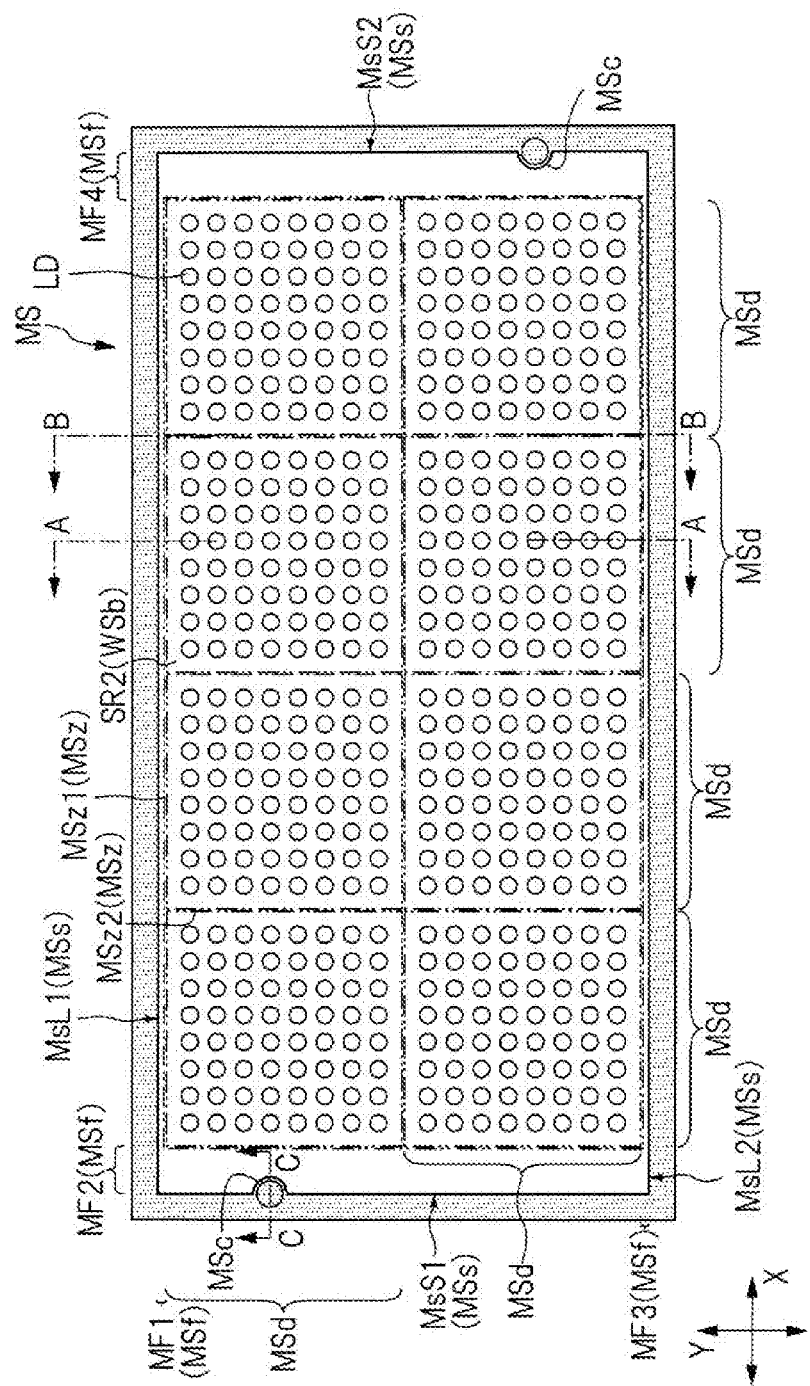
FIG. 17 is a plan view of a state in which a sealing body is formed on the upper surface side of the wiring substrate shown in FIG. 16, as viewed from the lower surface side.
Figure 18:
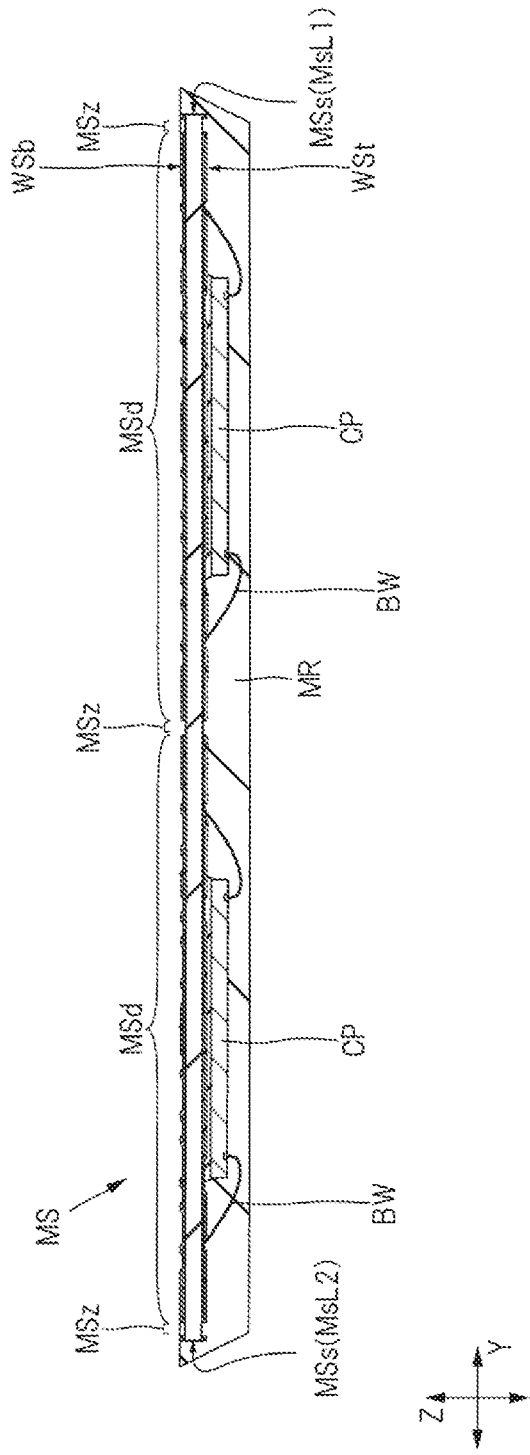
FIG. 18 is a cross-sectional view taken along line A-A of FIG. 17.

Next, as a resin sealing process shown in FIG. 5, the semiconductor chip CP shown in FIG. 16 is sealed with a resin to form a sealing body. FIG. 17 is a plan view of a state in which a sealing body is formed on the upper surface side of the wiring substrate shown in FIG. 16, as viewed from the lower surface side. FIG. 18 is a cross-sectional view taken along line A-A of FIG. 17.

As shown in FIG. 18, in this step, a plurality of device regions MSd is collectively covered with one sealing body MR. As shown in FIGS. 17 and 18, in this step, each of the plurality of side surfaces MSs of the wiring substrate MS is covered with the sealing body MR. In detail, each of the side surface MSs having the long side MsL1, the side surface MSs having the long side MsL2, the side surface MSs having the short side MsS1, and the side surface MSs having the short side MsS1 is covered with the sealing body MR. As shown in FIG. 7, in the wiring substrate MS of the present embodiment, the width W1 of the outer frame region MF1 and the width W3 of the outer frame region MF3 are narrow. Therefore, holes or slits for alignment cannot be formed in the outer frame regions MF1 and MF3. However, in the present embodiment, since each of the plurality of side surfaces MSs of the wiring substrate MS is sealed so as to be covered with the sealing body MR, the margin of the alignment accuracy can be increased as compared with the case where the sealing body is formed on a part of the upper surface WSt of the wiring substrate MS.

Details of the resin sealing process of the present embodiment will be described below in order. As shown in FIG. 5, the resin sealing process of the present embodiment includes a mold preparation step, a substrate holding step, a resin supplying step, a substrate immersion step, and a resin curing step.

Figure 19:
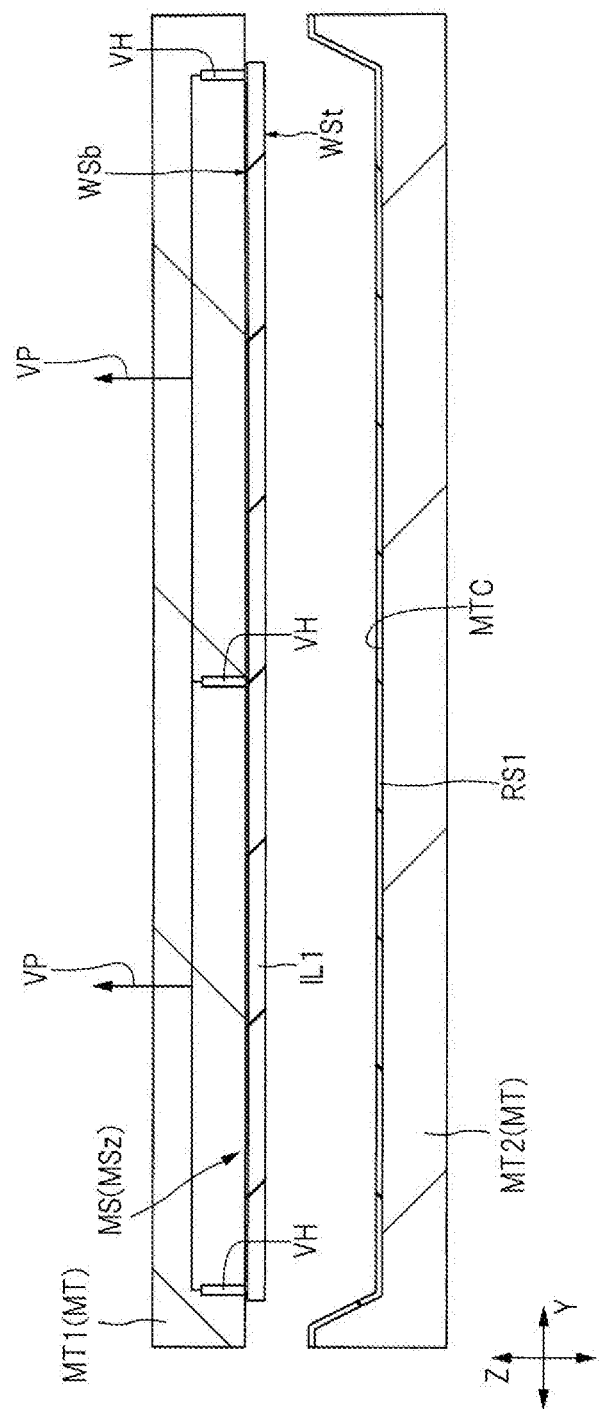
FIG. 19 is a cross-sectional view taken along line B-B of FIG. 17, showing a state in which the wiring substrate is disposed in the molding die.

In the mold preparation step, a mold MT shown in FIG. 19 is prepared. FIG. 19 is a cross-sectional view taken along line B-B of FIG. 17, showing a state in which the wiring substrate is disposed in the molding die. The mold MT includes an upper mold (first mold) MT1 disposed above the wiring substrate MS and a lower mold (second mold) MT2 disposed below the wiring substrate MS. In the resin sealing process, a sealing body (MR) (see FIG. 18) is formed (MS) such that the lower surface WSb faces the upper mold MT1 and such that the upper surface WSt faces the lower mold MT2. For this reason, the upper mold MT1 has a plurality of suction holes VH for holding the lower surface WSb of the wiring substrate MS. As schematically connected to FIG. 19, each of the plurality of suction holes VH is connected to the intake path VP. The upper mold MT1 has a structure in which the wiring substrate MS can be held by suction at the tip of the plurality of suction holes VH by suction of gas (e.g., air) at the tip of the plurality of suction holes VH via the suction path VP.

The lower mold MT2 has a cavity MTc, which is a mold for forming the sealing body MR. The cavity MTc is covered with the release sheet RS1. The release sheets RS1 are thin films made of resins, for example. By arranging the release sheets RS1 between the cavity MTc and the sealing body MR (see FIG. 18), the detachability between the lower mold MT2 and the sealing body MR can be improved after the sealing body MR is formed. In addition, since the sealing the resin can be prevented from adhering to the lower mold MT2, the cleaning operation of the lower mold MT2 can be omitted or shortened.

Figure 20:
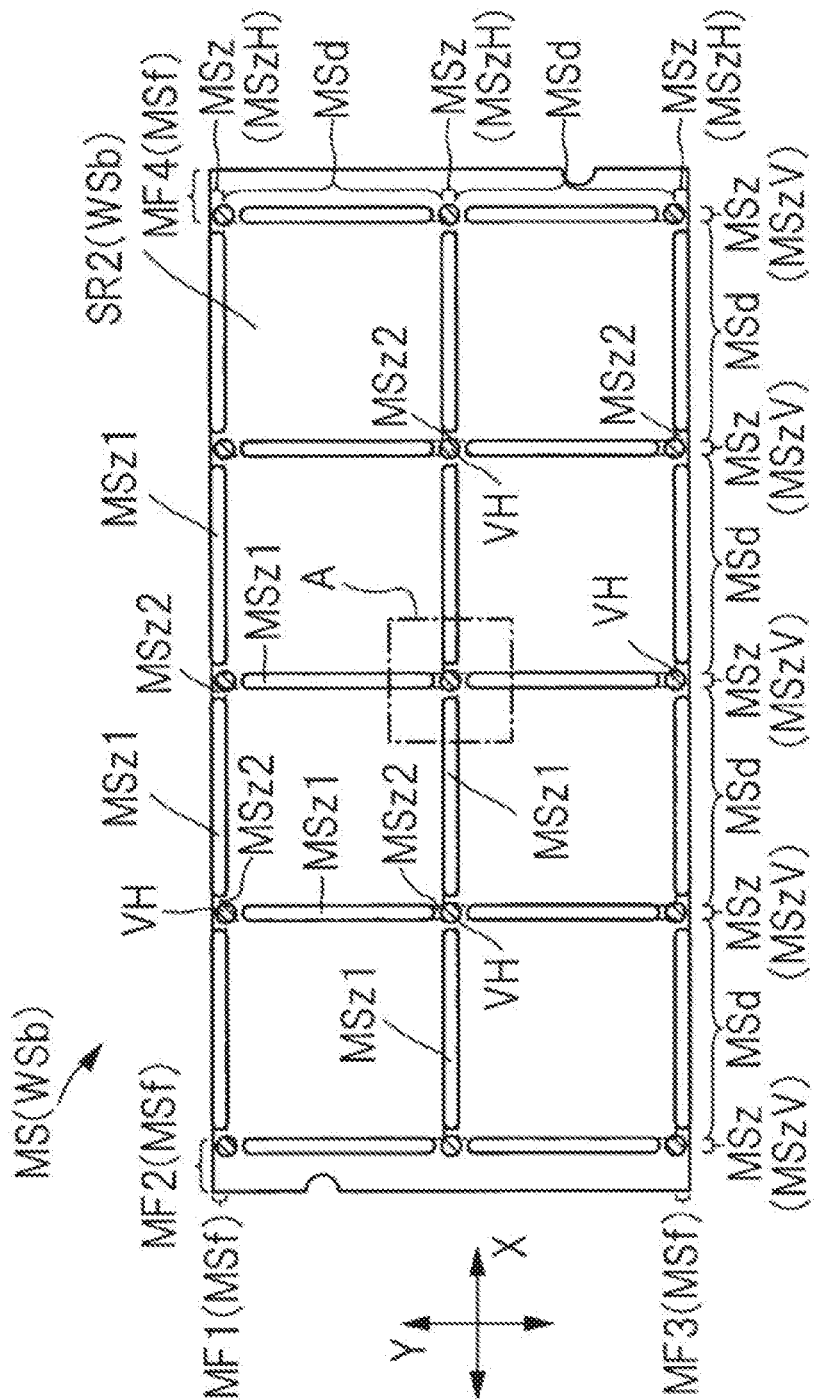
FIG. 20 is a plan view showing a planar positional relationship between the plurality of suction holes and the wiring substrate shown in FIG. 19 in the substrate holding step shown in FIG. 5.
Figure 21:
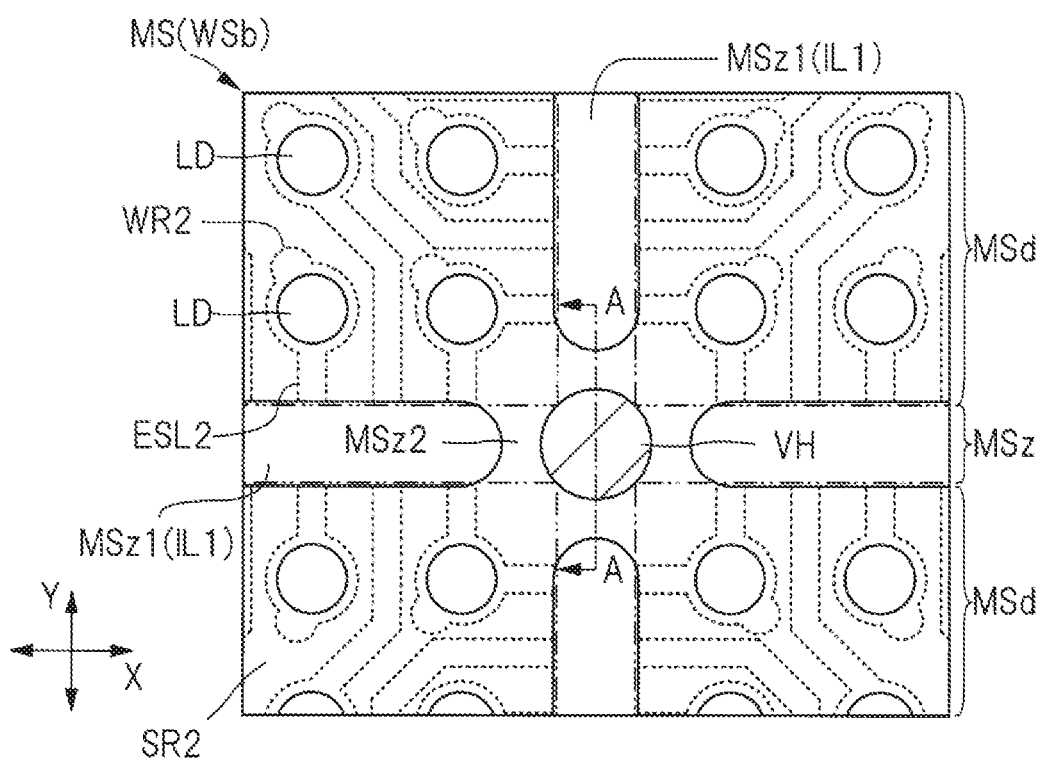
FIG. 21 is an enlarged plan view of part A of FIG. 20.
Figure 22:
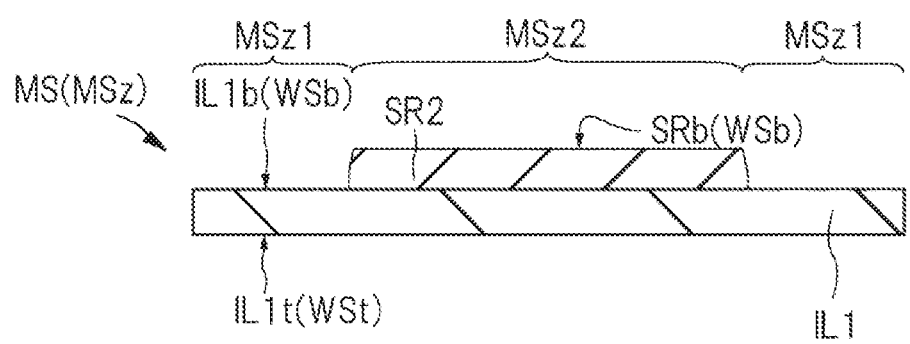
FIG. 22 is an enlarged cross-sectional view taken along line A-A of FIG. 21.
Figure 23:
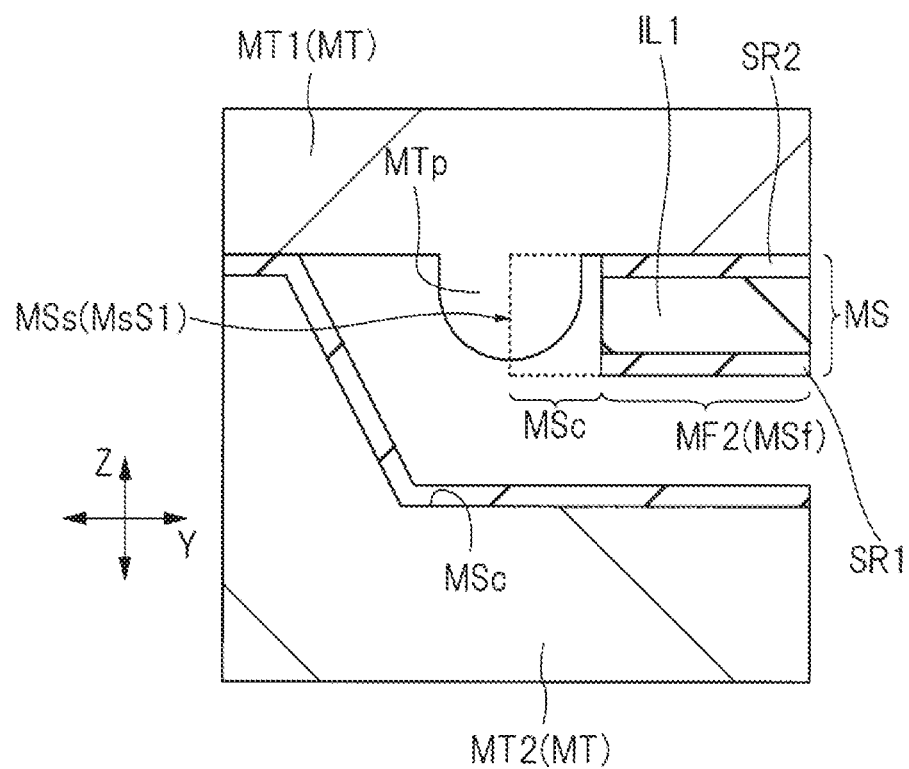
FIG. 23 is an enlarged cross-sectional view showing the positional relationship between the concave portion of the wiring board and the positioning pin of the molding die in the cross-sectional view along the line C-C of FIG. 17.

In the substrate holding step performed after the mold preparing step, as shown in FIG. 19, the wiring substrate MS is disposed between the upper mold MT1 and the lower mold MT2. The lower surface WSb of the wiring substrate MS is adsorbed by the plurality of suction holes VH, whereby the upper mold MT1 holds the wiring substrate MS with the upper surface WSt of the wiring substrate MS facing downward. FIG. 20 is a plan view showing a planar positional relationship between the plurality of suction holes and the wiring substrate shown in FIG. 19 in the substrate holding step shown in FIG. 5. FIG. 21 is an enlarged plan view of part A of FIG. 20; FIG. 22 is an enlarged cross-sectional view taken along line A-A of FIG. 21. FIG. 23 is an enlarged cross-sectional view showing the positional relationship between the concave portion of the wiring board and the positioning pin of the molding die in the cross-sectional view along the line C-C of FIG. 17. In FIGS. 20 and 21, the width of the cut region MSz is shown to be larger than that in FIG. 7 for the sake of clarity. In FIGS. 20 and 21, the positions of the suction holes VH are indicated by hatching. In FIG. 20, the outlines of the conductive patterns formed in the device region MSd and covered with the insulating film SR2 are indicated by dotted lines, i.e., the wiring WR2, the feeder line ESL2, and the lands LD.

In the case of the present embodiment, as shown in FIG. 19, the wiring substrate is held by the suction force by the plurality of suction holes VH, and other holding means, such as a chuck or a support plate for holding the upper surface WSt side of the wiring substrate, are not provided in the molding die MT. For this reason, a high suction force is required in order to securely hold the wiring substrate MS in the upper mold MT1 during the resin sealing process. As a method of improving the suction force, the inventor of the present application has examined a method of increasing the number of suction holes, in other words, the number of suction target portions of the wiring substrate MS, and a method of improving the suction force of each of the plurality of suction holes.

In the wiring substrate MS, as shown in FIG. 7, the width W1 of the outer frame region MF1 and the width W3 of the outer frame region MF3 are narrow. If only the outer frame region MF2 and the outer frame region MF4 are supposed to be attractable regions, the attraction force is insufficient. Therefore, in the present embodiment, as shown in FIG. 20, in addition to the outer frame MSf, the adsorbed portion MSz2 is also provided between the plurality of device regions MSd. However, when any position of the device region MSd is adsorbed, there is a fear that a member in the device region MSd may be damaged depending on the strength of the suction force, and therefore, it is preferable to provide the adsorbed portion MSz2 in the cut region MSz. In the embodiment shown in FIG. 20, the suction target portions MSz2 are provided at 15 locations including 12 locations in contact with the outer frame MSf and 3 locations surrounded by the plurality of device regions MSd, and each of the 15 suction target portions MSz2 faces the suction holes VH in the substrate holding step. In addition, in the examples shown in FIG. 20, the cutting area MSz includes a plurality of cutting lines MSzH extending in the X direction (three in FIG. 20) and a plurality of cutting lines MSzV extending in the Y direction (five in FIG. 20). Each of the plurality of adsorbed portions MSz2 is arranged at an intersection of the plurality of cutting lines MSzH and the plurality of cutting lines MSzV.

As shown in FIG. 13, the conductive pattern MP2 and the insulating film SR2 in the cutting region MSz are removed, such that a step is formed between the cutting region MSz and the region where the conductive pattern MP2 and the insulating film SR2 are present in the device region MSd. When the suction hole VH shown in FIG. 19 overlaps with the step of the cutting region MSz shown in FIG. 13, a gap is generated between the suction hole VH and the wiring substrate MS, such that the suction force is lowered. Therefore, when the portion to be adsorbed is provided in the cutting region MSz, it is necessary to prevent a gap from being generated between the suction hole VH and the wiring substrate MS.

Therefore, in the present embodiment, as shown in FIGS. 20 and 21, the cut area MSz of the lower surface WSb of the wiring substrate MS includes a plurality of portions (groove portions MSz1) exposed from the insulating film SR2 and a plurality of portions (adsorbed portions MSz2) covered with the insulating film SR2. In the substrate holding step, the wiring substrate MS is sucked and fixed to the upper mold MT1 (see FIG. 19) with the plurality of sucked portions MSz2 of the cutting area MSz and the plurality of suction holes VH facing each other. Since the insulating film SR2 is formed in the adsorbed portion MSz2 and the peripheral area thereof, there is no step as shown in FIG. 13. In this case, in the substrate holding step, a gap does not easily occur between the suction hole VH and the wiring substrate MS. Further, in the groove portion MSz1, the insulating film SR2 is removed, and the insulating layer IL1 serving as a base layer is exposed. That is, in the groove portion MSz1, the conductive patterns including the connecting wire ESL3 shown in FIG. 12 are removed. Therefore, clogging or wear of the blade can be suppressed in the package dicing step. In the embodiment shown in FIG. 20, the plurality of groove portions MSz1 are arranged between adjacent adsorbed portions MSz2.

In each of the plurality of adsorbed portions MSz2 on the lower surface WSb of the wiring substrate MS shown in FIG. 20, as shown in FIG. 22, the insulating film SR2 and the insulating film IL1 face each other without interposing conductive patterns therebetween. In other words, a conductive pattern such as the feeder line ESL2 and the connecting wire ESL3 shown in FIG. 12 is not formed on the adsorbed portion MSz2. As shown in FIGS. 11 and 13, when there is a conductive pattern MP2 between the insulating film SR2 and the insulating film IL1, unevenness is likely to be formed on the surface of the insulating film SR2 in accordance with the shape of the conductive pattern MP2. In this embodiment mode, the insulating film SR2 can be formed flat on the lower surface IL1b of the insulating film IL1. As a result, in the board holding step, a gap is hardly generated between the suction holes VH shown in FIG. 19 and the adsorption part MSz2 shown in FIG. 22. Therefore, the suction force of one suction hole VH can be improved. Further, in the present embodiment, since the metallic material is not disposed on the MSz2 of the suction target portion of the cutting area MSz, clogging or wear of the blade can be suppressed in the package dicing step.

Since the adsorbed portion MSz2 does not have the conductive pattern MP2, the height of the surface SRb of the insulating film SR2 in the adsorbed portion MSz2 when the lower surface IL1b of the insulating layer IL1 is the reference surface may be lower than the height of the surface SRb of the insulating film SR2 covering the conductive pattern MP2 shown in FIG. 13. However, in the substrate holding step, the insulating film SR2 is elastically deformed by pressing the wiring substrate MS shown in FIG. 19 against the upper mold MT1. Although the degree of elastic deformation is not so great, if the height of the surface SRb in the entire adsorbed portion MSz2 shown in FIG. 22 is flattened, the opening portion end of the suction hole shown in FIG. 19 can be pressed against the insulating film SR2.

In the embodiment shown in FIG. 22, the insulating film SR1 (see FIG. 13) is not disposed on the upper surface WSt of the wiring substrate MS on the other side of the adsorbed portion MSz2. In the substrate holding step, the upper surface WSt of the wiring substrate MS does not contact the suction hole VH shown in FIG. 19. Therefore, it is unnecessary to consider a step difference between the cutting region MSz and the device region MSd shown in FIG. 13. Therefore, in the embodiment shown in FIG. 22, the insulating film SR1 is not disposed on the upper surface WSt of the wiring substrate MS on the other side of the adsorbed portion MSz2. In this case, the work can be facilitated in the opening forming step and the conductive pattern removing step in the substrate preparation step described above. As a modification to FIG. 22, the insulating film SR1 may be disposed on the upper surface WSt of the wiring substrate MS on the other side of the adsorbed portion MSz2.

In the substrate holding step, the positional relationship between the molding die MT shown in FIG. 19 and the wiring substrate MS in plan view is controlled to perform the alignment.

Figure 24:
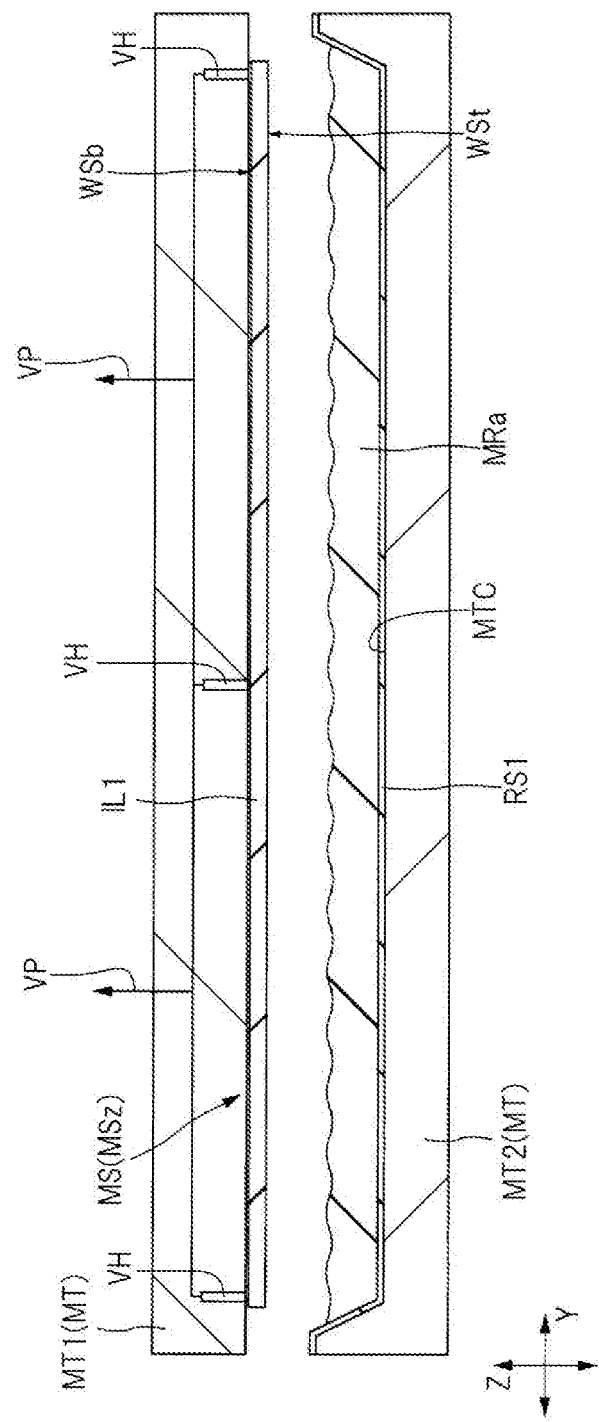
FIG. 24 is a cross-sectional view showing a state in which the resin is supplied and softened into the cavity of the lower mold shown in FIG. 19.

As shown in FIG. 7, each of the short side MsS1 and the short side MsS2 has a concave portion MSc recessed toward the plurality of device regions MSd in plan view. In the substrate holding step, alignment is performed using the concave portion MSc. More specifically, as shown in FIG. 23, the upper mold MT1 includes positioning pins MTp. In the substrate holding step, the concave portions MSc of the wiring substrate MS and the positioning pins MTp are arranged so as to overlap with each other, whereby the upper mold MT1 and the wiring substrate can be aligned with each other. Further, the positional relation between the upper mold MT1 and the lower mold MT2 is adjusted in advance, and as a result, the alignment between the lower mold MT2 and the wiring substrate MS is completed by performing the alignment between the upper mold MT1 and the wiring substrate MS. In FIG. 23, the positional relation between the concave portions MSc on the short side MsS1 and the positioning pins MTp has been described, but the short side MsS2 shown in FIG. 17 also has the same structures as in FIG. 23. That is, the upper mold MT1 includes the positioning pins MTp at two or more positions, i.e., a position overlapping with the concave portion MSc of the short side MsS1 and a position overlapping with the concave portion MSc of the short side MsS2 as shown in FIG. 17. In the substrate holding step, by arranging the plurality of concave portions MSc of the wiring substrate MS and the plurality of positioning pins MTp so as to overlap each other, it is possible to align the upper mold MT1 and the wiring substrate. In FIG. 23, the release sheet RS1 covering the lower mold MT2 and the upper mold MT1 are in contact with each other, but the release sheet RS1 and the upper mold MT1 are in contact with each other in the substrate immersion step. When the release sheet RS1 contacts the upper mold MT1, the resin MRa shown in FIG. 24 is disposed in the cavity MSc. Therefore, in the substrate immersion step, all the side surfaces MSs of the wiring substrate MS are covered with the resin MRa.

As described above, when the width W1 of the outer frame region MF1 and the width W3 of the outer frame region MF3 substrate in FIG. 7 are wide, the through holes (slits) for alignment can be formed in the outer frame region MF1 and the outer frame region MF3, respectively. When the through holes for alignment are arranged along the long side, the alignment accuracy between the sealing mold and the wiring substrate is improved. In particular, in the resin sealing process, since the resin for sealing is cured by heating, in order to maintain the positional relationship between the molding die MT and the wiring substrate MS with high accuracy in accordance with the thermal expansion (or thermal contraction during cooling) of the wiring substrate MS, it is preferable that the through slits for alignment are arranged along the long side.

In the case of the resin sealing process of the present embodiment, as shown in FIG. 17, each of the plurality of side surfaces MSs of the wiring substrate MS is covered with the sealing body MR. In this case, as compared with the case where the sealing body MR is formed in a partial region on the wiring substrate MS, high alignment accuracy during curing of the resin is not required. However, as described above, in the resin sealing process of the present embodiment, the suction holes VH need to be brought into close contact with the predetermined adsorption portions MSz2 of the lower surface WSb of the wiring substrate MS shown in FIG. 20. Therefore, at least in the substrate holding step, a certain degree of alignment accuracy is required.

As shown in FIG. 7, the wiring substrate MS has one recess MSc in each of the short side MsS1 and the short side MsS2. The position of the MSc in the Y-direction is displaced from the center of the short side MsS1 and the short side MsS2 to one of the long sides of the MSc. The concave portion MSc of the short side MsS1 is formed at a position closer to the long side MsL1 than the long side MsL2 in the Y-direction. The concave portion MSc of the short side MsS2 is formed at a position closer to the long side MsL2 than the long side MsL1 in the Y-direction. With this layout, even when the wiring substrate MS is provided with the concave portion MSc at one position of each of the short sides MsS1 and MsS2, the wiring substrate MS can be aligned in the X direction and the Y direction. As a result, in the substrate holding step, as shown in FIG. 20, the suction holes VH can be brought into close contact with each of the plurality of adsorption portions MSz2 of the wiring substrate MS.

In the embodiment shown in FIG. 7, the wiring substrate MS is provided with recesses MSc at respective ones of the short sides MsS1 and MsS2. However, as a modification, one or both of the short sides MsS1 and MsS2 may include a plurality of recesses MSc. For example, when one of the short sides MsS1 and MsS2 has two concave portions MSc and the other has one concave portion MSc, the direction in which the wiring substrate MS is arranged can be easily visually recognized, such that an error in the arrangement direction can be suppressed.

In the resin supplying step performed after the mold preparing step, as shown in FIG. 24, the resin MRa is supplied into the cavity MTc of the lower mold MT2. FIG. 24 is a cross-sectional view showing a state in which the resin is supplied and softened into the cavity of the lower mold shown in FIG. 19. More specifically, the cavity MTc is covered with the release sheet RS1, and the resin MRa is supplied onto the release sheet RS1. The resin MRa is a raw material resin of the sealing body MR shown in FIGS. 17 and 18. The resin MRa includes, in addition to a thermosetting resin, filler particles for adjusting the coefficient of linear expansion of the sealing body MR, and a material such as carbon black for blackening the color of the sealing body MR. In the sealing step of the present embodiment, a compression molding method is applied in which sealing is performed by immersing a plurality of semiconductor chips CP (see FIG. 18) and a plurality of wires BW in a resin MRa softened in a cavity MTc.

The compression molding method is distinguished from a transfer molding method in which a softened resin is injected under pressure into a space sandwiched between the cavity MTc and the wiring substrate MS. In the case of the compression molding method, as compared with the transfer molding method, the flow of the resin MRa during the resin sealing process is small enough to make the resin MRa look substantially absent. Therefore, it is preferable to suppress the deformation of the member on the wiring substrate MS, particularly, the wire BW (see FIG. 18) caused by the flow of the resin MRa.

However, as the material of the resin MRa, the same material as the resin used in the transfer molding method can be used. In the transfer molding method, pellets of a raw material resin are softened in a container called a pot and then pressed to be supplied into the cavity. On the other hand, in the case of the compression molding system, the raw material resin formed into granules is placed in the cavity MTc and then softened in the cavity MTc.

As shown in FIG. 5, the order of the substrate holding step and the resin supplying step is not particularly limited. In this specification, the substrate holding step has been described above, but the resin supplying step may be performed first. Further, for example, after a granular raw material resin is supplied into the cavity MTc, a substrate holding step may be performed, and then the raw material resin may be heated to obtain a softened resin MRa. In this case, the heat retention time of the resin MRa can be shortened as compared with the case where the resin supplying step is performed first. In addition, the substrate holding step can be performed while the lower mold MT2 is not heated.

Figure 25:
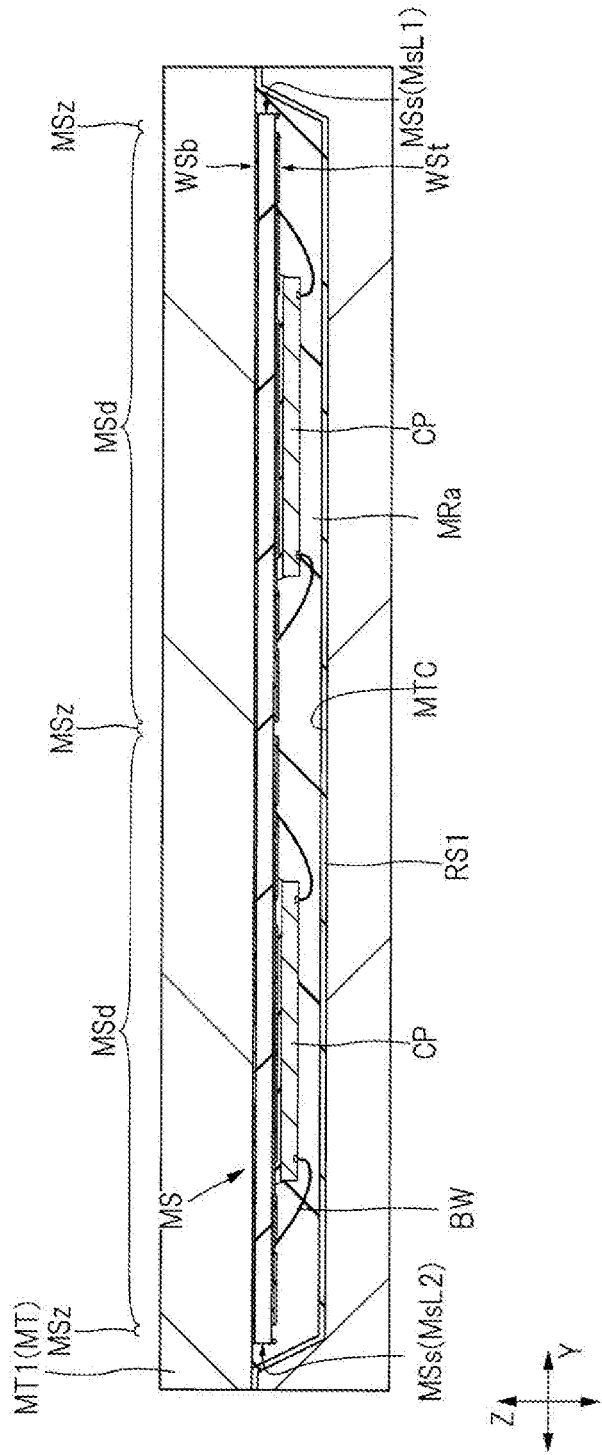
FIG. 25 is a cross-sectional view showing a state in which the distance between the upper mold and the lower mold shown in FIG. 24 is reduced.

In the substrate immersion step performed after the substrate holding step and the resin supplying step, as shown in FIG. 25, the semiconductor chip CP is immersed in the cavity MTc to seal the semiconductor chip CP. FIG. 25 is a cross-sectional view showing a state in which the distance between the upper mold and the lower mold shown in FIG. 24 is reduced. However, FIG. 25 is a cross-sectional view taken along line A-A of FIG. 17.

In the substrate immersion step, the distances between the upper mold MT1 and the lower mold MT2 are reduced such that the semiconductor chip CP, the upper surface WSt of the wiring substrate MS, and the plurality of side surfaces MSs of the wiring substrate MS are covered with the resin MRa in the cavity MTc, respectively. As shown in FIG. 25, in this step, each of the semiconductor chip CP and the plurality of wires BW is sealed in the resin MRa. Of the plurality of side surfaces MSs shown in FIG. 17, FIG. 25 shows a cross section in which the side surface MSs having the long side MsL1 and the side surface MSs having the long side MsL2 are covered with the resin MRa. However, as can be seen from FIG. 17, in this step, each of the side surface MSs having the long side MsL1, the side surface MSs having the long side MsL2, the side surface MSs having the short side MsS1, and the side surface MSs having the short side MsS1 is covered with the resin MRa shown in FIG. 25.

As a study example of the present embodiment, there is a method of forming the sealing body MR by applying a compression molding method to a part of the upper surface WSt of the wiring substrate MS shown in FIG. 18. In this instance, since it is necessary to prevent the outer edge of the cavity MTc from shifting outward from the outer edge of the upper surface WSt of the wiring substrate MS in plan view, it is necessary to sufficiently increase the areas of the outer frame region MF1 and the outer frame region MF3 shown in FIG. 16.

In the present embodiment, since each of the plurality of side surfaces MSs shown in FIG. 17 is accommodated inside the cavity MTc shown in FIG. 25 in plan view, the area of the outer frame region MF1 and the outer frame region MF3 shown in FIG. 17 is advantageously smaller. In addition, the areas of the outer frame region MF2 and the outer frame region MF4 can be reduced to the extent that the concave portion MSc for alignment can be disposed.

Figure 29:
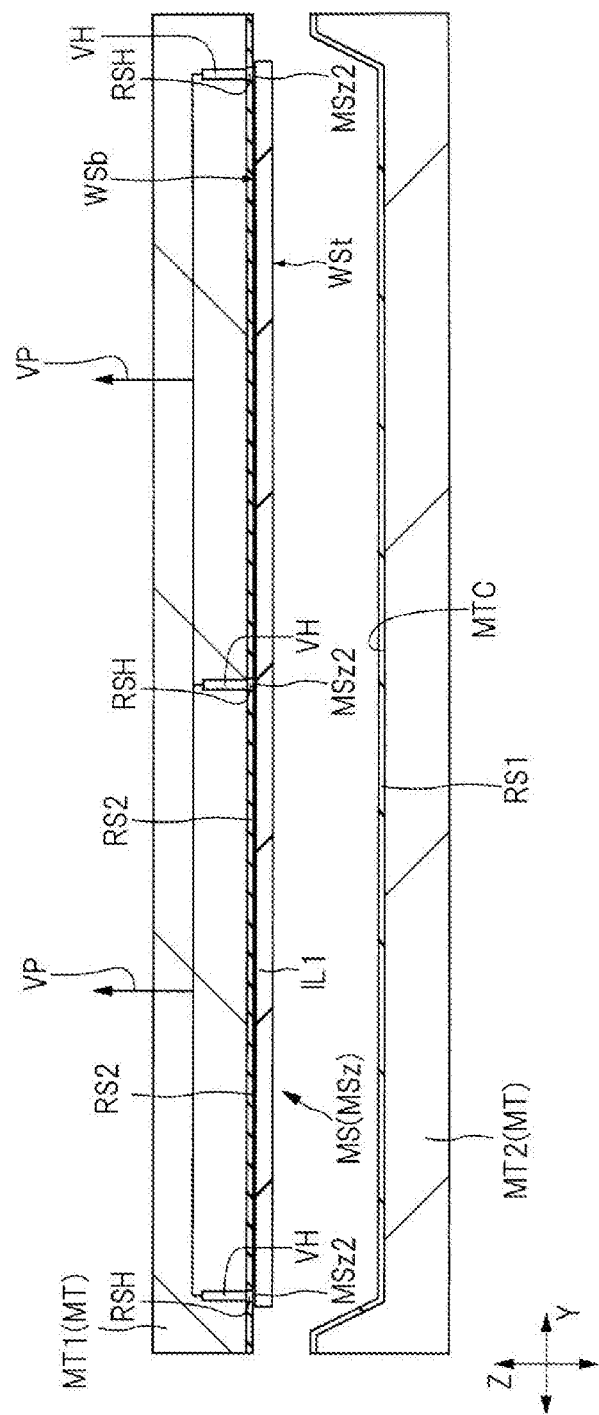
FIG. 29 is a cross-sectional view showing a modification to FIG. 19.

In the resin curing step performed after the substrate immersion step, the resin MRa shown in FIG. 25 is heated to cure the thermosetting resin included in the resin MRa. When it takes time to cure the thermosetting resin, the wiring substrate MS may be taken out from the molding die MT after being temporarily cured in the cavity MTc, and the wiring substrate MS may be fully cured in a heating furnace. The temporary curing is to cure the resin MRa to such an extent that the resin MRa can maintain its shape when it is taken out from the molding die MT. The main curing is to cure the semiconductor device until the semiconductor device is substantially the same as the sealing body MR of the semiconductor device PKG1 shown in FIG. 3, which is the final product. Through this process, the sealed body MR shown in FIGS. 17 and 18 is obtained. As shown in FIG. 25, since the release sheet RS1 is disposed between the resin MRa and the cavity MTc, the release sheet RS1 is easily peeled off from the resin MRa (or the sealing body MR shown in FIG. 18) if the distances between the upper mold MT1 and the lower mold MT2 are increased. On the other hand, since the wiring substrate MS and the upper die MT1 are held by the suction force by the plurality of suction holes VH shown in FIG. 19, if the suction from the suction holes VH is stopped, the wiring substrate MS and the upper die MT1 are easily separated from each other. Note that although a part of the resin MRa contacts the upper mold MT1, the contact area of the resin MRa is small, such that the separation between the upper mold MT1 and the printed circuit board is not hindered. However, when the resin MRa adheres to the upper mold MT1 by selecting materials and the like included in the resin MRa, the release sheets RS2 may be interposed between the wiring substrate MS and the upper mold MT1 as shown in FIG. 29, which will be described later as a modification.

<Ball Mounting Step>

Figure 26:
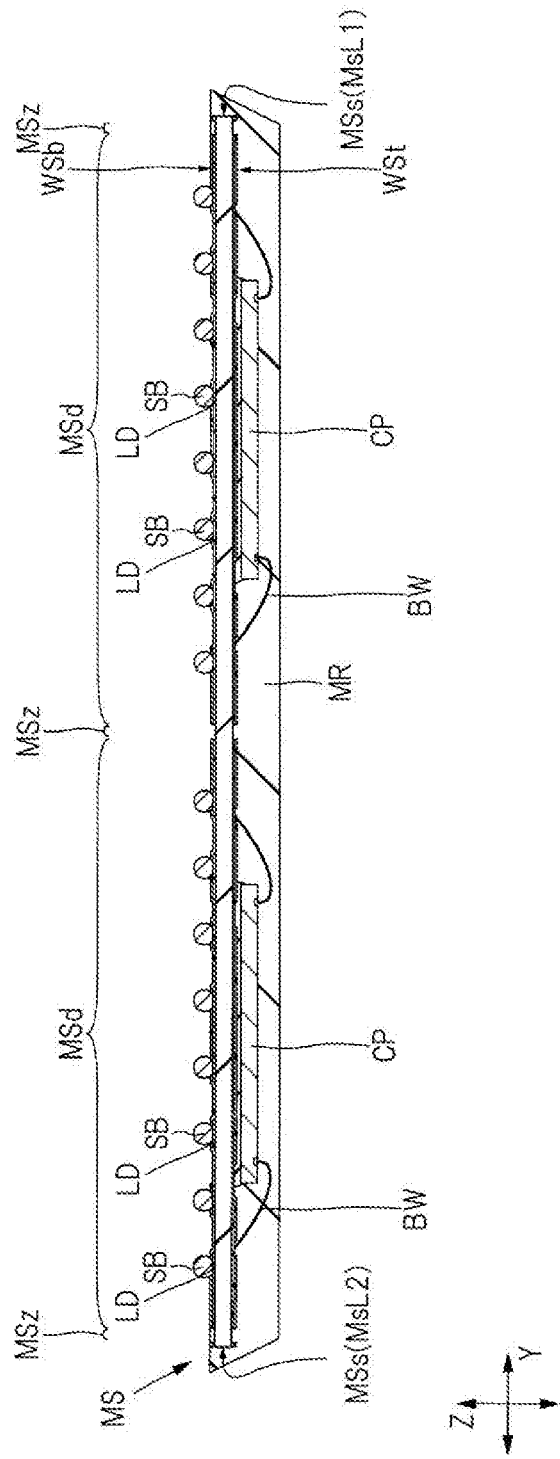
FIG. 26 is a cross-sectional view showing a state in which solder balls are bonded on a plurality of lands of the wiring board shown in FIG. 18.

Next, as a ball mounting step shown in FIG. 5, a plurality of solder balls SB is bonded to a plurality of lands LD formed on the lower surface WSb of the wiring substrate MS as shown in FIG. 26. FIG. 26 is a cross-sectional view showing a state in which solder balls are bonded on a plurality of lands of the wiring substrate shown in FIG. 18. In this step, after the solder balls SB are disposed on the respective lands LD exposed on the lower surface WSb of the wiring substrate MS, the plurality of solder balls SB and the lands LD are joined by heating. In this step, the plurality of solder balls SB are electrically connected to the semiconductor chip CP via the wiring substrate MS. However, the technique described in this embodiment is not limited to a so-called Ball Grid Array semiconductor device in which solder balls SBs are bonded to the semiconductor device. For example, as a modification to the present embodiment, the semiconductor device can be applied to a so-called LGA (Land Grid Array) type semiconductor device in which the semiconductor device is shipped in a state in which the solder balls SB are not formed and the lands LD are exposed, or in a state in which the solder pastes are applied to the lands LD so as to be thinner than the solder balls SB.

<Package Dicing Step>

Figure 27:
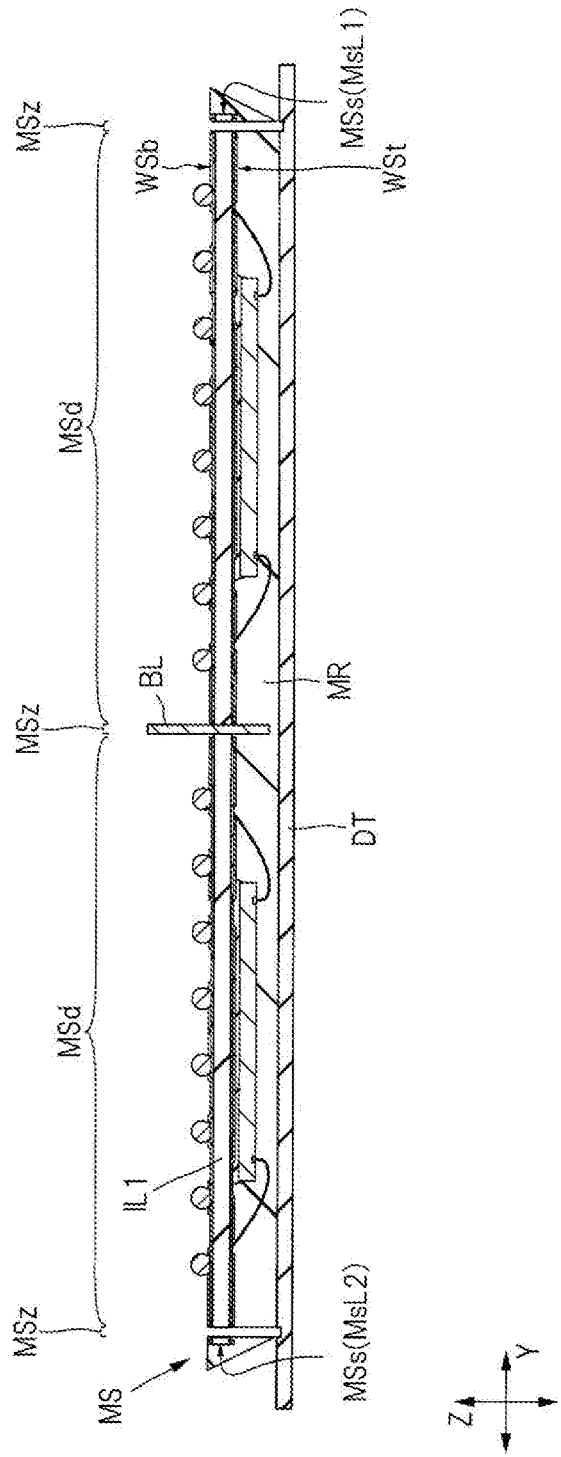
FIG. 27 is a cross-sectional view showing a step of cutting the wiring substrate and the sealing body shown in FIG. 18.

Next, as the package dicing step shown in FIG. 5, the wiring substrate MS and the sealing body MR are cut along the cutting region MSz surrounding each of the peripheries between the plurality of device regions MSd shown in FIG. 17, and each of the plurality of device regions MSd is diced. FIG. 27 is a cross-sectional view showing a step of cutting the wiring substrate and the sealing body shown in FIG. 18.

In the package dicing step, as shown in FIG. 27, the blade (dicing blade, rotating blade) BL is rotated along the cutting region MSz to approach the cutting region MSz on the lower surface WSb side of the wiring substrate MS. During the package dicing step, a fixing tape (dicing tape) DT, which is a fixing jig, is attached to the upper surface MRt of the sealing body MR. As a result, the wiring substrate MS is fixed on the fixing tape DT. The fixing tape DT is an example of fixing the wiring substrate MS, and there are various modified examples such as a fixing jig other than the tape. Hard particles such as diamond are embedded in the surface of the blade BL. Therefore, when the blade BL comes into contact with the wiring substrate MS or the sealing body MR, the wiring substrate MS or the sealing body MR is cut.

In the package dicing step, the blade BL is moved along the extending direction of the cutting region MSz shown in FIG. 17. During the movement of the blade BL, the blade BL is continuously rotating. As a result, in the cutting region MSz shown in FIG. 17, the wiring substrate MS and the sealing body MR are cut in order. As shown in FIG. 13, in the present embodiment, the conductive patterns MP1 and MP2 are not arranged in the cutting area MSz. The conductive patterns MP1 and MP2 can be cut by the blade BL. However, in this case, metal scrap may be generated during the cutting process, and there is a concern that the wiring may be short-circuited due to the metal scrap. Further, the metallic material has higher toughness than the material of the insulating layers IL1 of the wiring substrate MS and the material of the sealing body MR shown in FIG. 27. For this reason, there is a concern that a problem such as clogging of metal debris between the abrasive grains of the blade BL or promotion of wear of the main body of the blade BL may occur during the cutting process. In the case of the present embodiment, since there is no metal material in the cutting region MSz, the above-described problem can be suppressed.

In the resin sealing process described above, each of the plurality of adsorbed portions MSz2 shown in FIG. 20 is sucked with a strong suction force. Therefore, adsorption marks may remain on the insulating film SR2 on the suction target MSz2. In some cases, adsorption marks may remain at the corners (around the intersections of the sides) of the diced semiconductor device PKG1 (see FIG. 2). The adsorption marks have a roughness on the surface of the insulating film SR2 as compared with other portions.

Through the above steps, the semiconductor device PKG1 described with reference to FIGS. 1 to 4 is obtained. Thereafter, necessary inspections and tests, such as appearance inspections and electrical tests, are performed, and they are shipped or mounted on a mounting board (not shown).

<Structure of Feeder Line>

Figure 28:
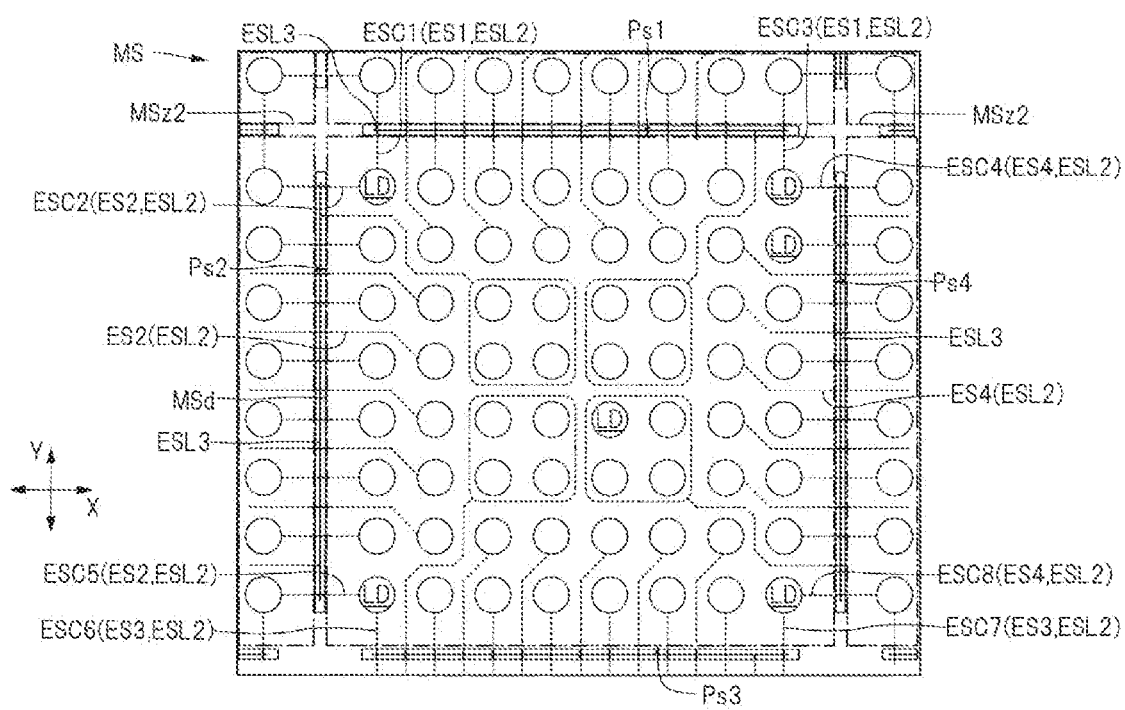
FIG. 28 is an enlarged plan view showing an example of the layout of the feeder lines formed is the device region in the substrate preparation step shown in FIG. 5.

Next, as described with reference to FIG. 21, a structure in which conductive patterns are not arranged on the adsorbed portion MSz2 of the adsorption target portion surrounded by the plurality of device regions MSd around the periphery of the device region MSd, and current is efficiently flown through each of the plurality of feeder lines s ESL2 shown in FIG. 12 will be described. As shown in FIG. 13, the feeder line ESL1 is formed on the upper surface WSt of the panel wiring substrate MSP, but in order to explain in detail the relation with the problem of bringing the suction holes VH shown in FIG. 19 into close contact in the substrate holding step shown in FIG. 5, the structure of the feeder line ESL2 formed on the lower surface WSb of the panel wiring substrate MSP will be mainly described below. FIG. 28 is an enlarged plan view showing an example of the layout of the feeder lines formed in the device region in the substrate preparation step shown in FIG. 5. FIG. 28 shows a condition in which the insulating film SR2 in a part of the cutting area MSz is removed in the opening portion forming step described with reference to FIG. 11. Therefore, each of the plurality of feeder lines ESL2 is connected to each other via the connecting wire ESL3.

As described as the plating step in the explanation of the substrate preparation step shown in FIG. 5, in the present embodiment, the metallic film PMF4 is formed by the electrolytic plating method on the portions of the conductive patterns MP2 exposed from the insulating film SR2, i.e., the lands LDs, shown in FIG. 11. When the electroplating step is performed, the conductive patterns MP2 are connected to external electrodes (not shown) via the feeder line ESL2 (see FIG. 12). In order to stably flow a current through the conductive patterns MP2, it is preferable that the plurality of feederlines ESL2 are connected to each other. Therefore, as shown in FIG. 12, a connecting wire ESL3 extending along the cutting region MSz is formed between the adjacent device regions MSd, and the plurality of feeder lines ESL1 and ESL2 are electrically connected to each other.

In order to simplify the construction of the connecting wire ESL3, a plurality of connecting wires ESL3 extending in the X direction and a plurality of connecting wires ESL3 extending in the Y direction may be crossed. In this instance, the connecting wire ESL3 is arranged in an area where the cutting line MSzH and the cutting line MSzV shown in FIG. 7 cross each other. In the present embodiment, the region where the cutting line MSzH and the cutting line MSzV intersect is used as the portion to be adsorbed shown in FIG. 20. Therefore, when the connecting wire ESL3 is arranged in the region where the cutting line MSzH and the cutting line MSzV intersect, a part of the connecting wire ESL3 remains.

Therefore, the inventor of the present application has examined a configuration in which the conductive patterns are not formed on the plurality of adsorbed portions MSz2 shown in FIG. 20, and the plurality of feeder lines ESL2 shown in FIG. 12 are electrically connected to each other when the electroplating is performed.

As shown in FIG. 28, the outer edge of each of the plurality of device regions MSd has a side Ps1 extending in the X direction and a side Ps2 extending in the Y direction intersecting the X direction. The outer edge of each of the plurality of device regions MSd is on the opposite side of the side Ps1, and has a side Ps3 extending in the X direction, and a side Ps4 extending in the Y direction, which is on the opposite side of the side Ps2. Each of the sides Ps1, the Ps2, the Ps3, and the Ps4 corresponds to the sides Ps1, the Ps2, the Ps3, and the Ps4 of the lower surface WSb of the wiring substrate WS shown in FIG. 2.

In the device region MSd, a plurality of lands LD and a plurality of feeder lines ESL2 connected to the plurality of lands LD are formed. The plurality of feeder lines ESL2 includes a plurality of feeder lines ES1 connected to any one of the plurality of lands LDs, extending along the side Ps1, and having one end arranged along the side Ps1. The plurality of feeder lines ESL2 includes a plurality of feeder lines ES2 connected to any one of the plurality of lands LDs, extending along the side Ps2, and having one end arranged along the side Ps2. The plurality of feeder lines ESL2 includes a plurality of feeder lines ES3 connected to any one of the plurality of lands LDs, extending along the side Ps3, and having one end arranged along the side Ps3. The plurality of feeder lines ESL2 includes a plurality of feeder lines ES4 connected to any one of the plurality of lands LDs, extending along the side Ps4, and having one end arranged along the side Ps4.

A part (at least one of the plurality of feeder lines ES1) and a part (at least one of the plurality of feeder lines ES2) are electrically connected to each other. In the embodiment shown in FIG. 28, one feeder line ES1 of the plurality of feeder lines ES1 is electrically connected to one feeder line ES2. One feeder line ES1 of the plurality of feeder lines ES1 is electrically connected to one feeder line ES4. Of the plurality of feeder lines ES2, one feeder line ES2 is electrically connected to one feeder line ES3. Of the plurality of feeder lines ES3, one feeder line ES3 is electrically connected to one feeder line ES4. As a result, the four connecting wires ESL3 arranged around the device region MSd are connected to each other via the feeder line ESL2. Further, since the plurality of divided connecting wires ESL3 are electrically connected to each other without passing through intersections of the respective sides, conductive patterns are not formed on the adsorbed portion MSz2.

As shown in FIG. 28, by electrically connecting two feeder lines ESL2 extending in different directions, even if conductive patterns are not arranged on the adsorbed portion MSz2, each of a plurality of connecting wires ESL3 extending in different directions is electrically connected via a plurality of feeder lines ESL2.

Note that the expression "the feeder line ES1 and the feeder line ES2 are electrically connected" includes a case where they are electrically connected via a plurality of wiring layers, in addition to a case where they are electrically connected only by the same wiring layer, as shown in FIG. 28. For example, as illustrated in FIG. 3, when the wiring layer WL1 and the wiring layer WL2 are provided, the feeder line ES1 and the feeder line ES2 illustrated in FIG. 28 are formed in the wiring layer WL2 illustrated in FIG. 3, but may be electrically connected to each other via the conductive patterns MP1 (see FIG. 13) formed in the wiring layer WL1.

However, from the viewpoint of stabilizing the current flowing through the seed layer when the electrolytic plating is performed, as shown in FIG. 28, it is preferable that each of the plurality of feeder lines ESL2 is electrically connected via the same wiring layer. In the embodiment shown in FIG. 28, a part of the plurality of feeder lines ES1 and a part of the plurality of feeder lines ES2 are connected to each other in the wiring layer WL2 shown in FIG. 3 in which the lands LDs are formed.

In the device region MSd, a plurality of feeder lines ESL2 may be connected to each other according to various modifications of the device region MSd. For example, in the example shown in FIG. 28, one end of each of the plurality of feeder lines ESL2 is disposed at the outer edge of the device region MSd, and the other end of the device region MSd is connected to the land LD. Therefore, for example, the feeder line ES1 and the feeder line ES2 are electrically connected to each other via the land LD. The feeder line ES1 and the feeder line ES4 are electrically connected to each other via a land LD. The feeder line ES2 and the feeder line ES3 are electrically connected to each other via a land LD. The feeder line ES3 and the feeder line ES4 are electrically connected to each other via a land LD. As a modification to FIG. 28, for example, the feeder line ES1 and the feeder line ES2 may be directly connected, and the connected portions may be connected to the lands LDs. Further, for example, the lead wiring may be connected to the land LD, and the feed line ES1 and the feed line ES2 may be connected to each other via the lead wiring. The lead wiring is a wiring that connects the land LDs and the via wiring WRv, for example, as in the wiring WR2 shown in FIG. 3 or FIG. 21.

Further, as shown in FIG. 28, of the plurality of feeder lines ES1, the corner line ESC1 located closest to the intersection point of the side Ps1 and the side Ps2 is electrically connected to any one of the plurality of feeder lines ES2. In the embodiment shown in FIG. 28, the corner wiring ESC1 is electrically connected to the corner wiring ESC2 located closest to the intersection point of the side Ps1 and the side Ps2 among the plurality of feeder lines ES2. From the viewpoint of electrically connecting the divided plurality of connecting wires ESL3 to each other, any one of the feeder lines ES1 and any one of the feeder lines ES2 may be electrically connected to each other.

However, when the feeder lines ESL2 extending in different directions are electrically connected to each other, the longer the feeder line ESL2 extends, the more complicated the wiring layout becomes. In the case of the wiring around the corner of the device region MSd as in the case of the corner wiring ESC1 and the corner wiring ESC2 shown in FIG. 28, the distance to the outer edge of the device region MSd can be shortened. In particular, when the corner wiring ESC1 and the corner wiring ESC2 are connected to each other, the extension length of the feeder line ESL2 can be particularly shortened. Therefore, as shown in FIG. 28, even when the corner wiring ESC1 and the corner wiring ESC2 are connected to each other only through the same wiring layers, the effect of layouts on other feeder lines ESL2 can be minimized.

In the example shown in FIG. 28, the corner wirings arranged at the four corner portions of the device region MSd are connected to each other. That is, the corner wiring ESC3 closest to the intersection point of the side Ps1 and the side Ps4 among the plurality of feed lines ES1 is connected to the corner wiring ESC4 closest to the intersection point of the side Ps1 and the side Ps4 among the plurality of feed lines ES4. Of the plurality of feeder lines ES2, the corner wiring ESC5 closest to the intersection point of the side Ps2 and the side Ps3 is connected to the corner wiring ESC6 closest to the intersection point of the side Ps2 and the side Ps3 among the plurality of feeders ES3. The corner wiring ESC7 closest to the intersection point of the side Ps3 and the side Ps4 among the plurality of feeder lines ES3 is connected to the corner wiring ESC8 closest to the intersection point of the side Ps3 and the side Ps4 among the plurality of feeder lines ES4.

The device region MSd shown in FIG. 28 corresponds to the lower surface WSb of the wiring substrate WS of the semiconductor device PKG1 shown in FIG. 2. Therefore, each of the plurality of feeder lines ESL2 remains in the PKG1 shown in FIG. 2. Although a duplicated description is omitted, in the above description, if the part described as the device region MSd is replaced with the lower surface WSb of wiring substrate WS, the device region MSd can be applied as a description of the completed semiconductor device PKG1. However, the plurality of connecting wires ESL3 shown in FIG. 28 are removed in the board preparing step shown in FIG. 5.

Although several modifications have been described in the above description, typical modifications other than those already described will be described below.

<Modification 1>

Figure 30:
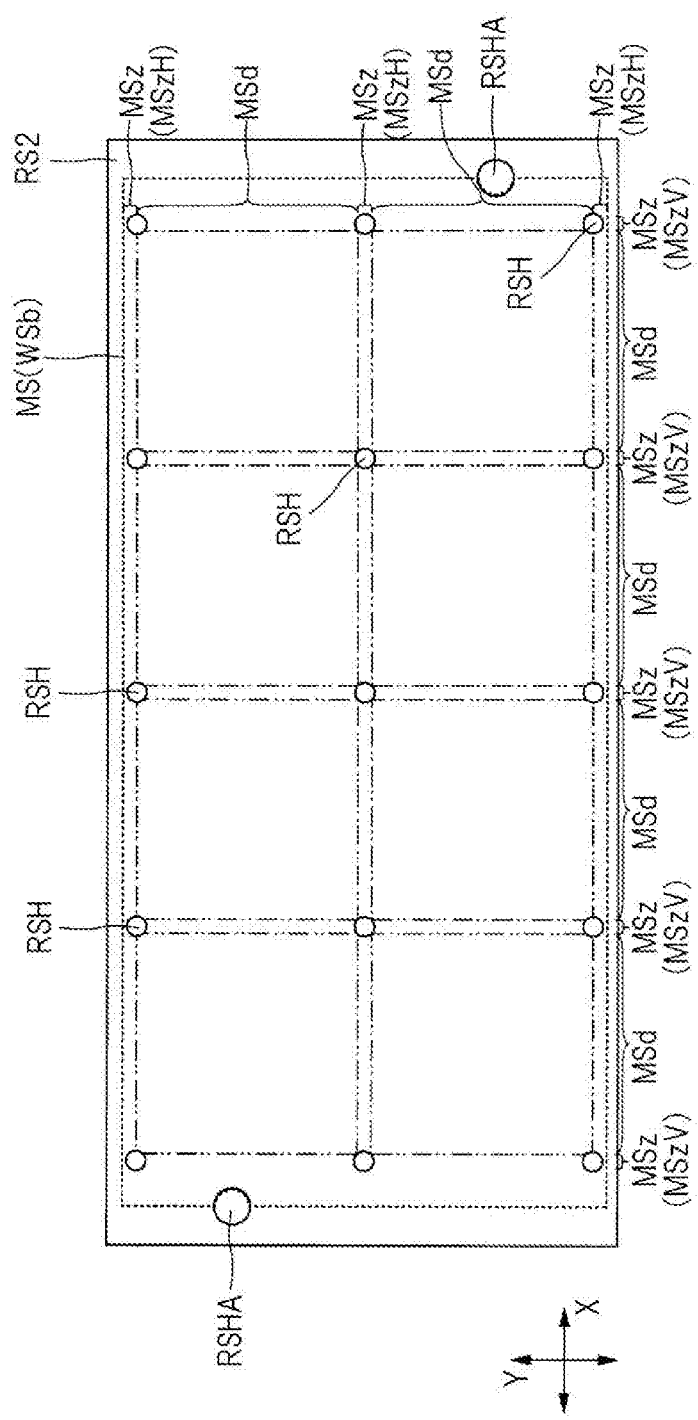
FIG. 30 is a plan view showing a state in which the releasing sheet and the wiring substrate shown in FIG. 29 are superposed on each other.

FIG. 29 is a cross-sectional view showing a modification to FIG. 19. FIG. 30 is a plan view showing a state in which the releasing sheet and the wiring substrate shown in FIG. 29 are superposed on each other. As the resin sealing process shown in FIG. 5, in the embodiment shown in FIG. 19, the upper mold MT1 sucks and holds the wiring substrate MS by bringing the suction holes VH of the upper mold MT1 into close contact with the adsorbed portion MSz2 of the wiring substrate MS in the substrate holding step.

The modified example shown in FIG. 29 is different from the example shown in FIG. 19 in that the releasing sheets RS2 are interposed between the wiring substrate MS and the upper mold MT1 during the period from the substrate holding step shown in FIG. 5 to the resin-curing step. As shown in FIG. 25, when a part of the upper mold MT1 contacts the resin MRa, depending on the components of the resin MRa, contamination caused by the resin MRa may adhere to the upper mold MT1. This requires a cleaning operation to remove the adhered dirt from the upper mold MT1. In the present modification, as shown in FIG. 19, the lower surface of the upper mold MT1, i.e., the surface holding the wiring substrate MS, is covered with the release sheet RS2. Therefore, the upper mold MT1 is not contacted with the resin MRa (see FIG. 25) in the resin sealing process. Therefore, the cleaning operation of the upper mold MT1 is not required, and the manufacturing efficiencies are improved. In addition, from another viewpoint, since the non-adhesion of the resin MRa to the upper mold MT1 can be suppressed, the degree of flexibility in selecting the materials of the resin MRa is improved.

The release sheet RS2 covering the lower surface of the upper mold MT1 differs from the release sheet RS1 covering the cavity MTc of the lower mold MT2 in the following points. In the resin sealing process, it is necessary to hold the wiring substrate MS by suction by the suction force of the suction hole VH. For this reason, the release sheet RS2 includes a plurality of through holes RSH penetrating through the thickness of the release sheet. Each of the plurality of through holes RSH is disposed at a position overlapping with the plurality of suction holes VH of the upper mold MT1 and the plurality of adsorption portions MSz2 of the wiring substrate MS in the substrate holding step. As shown in FIG. 30, the release sheet RS2 includes two or more through holes RSHA for positioning. The through-hole RSHA is formed at a position overlapping the positioning pin MTp (see FIG. 23) of the upper mold MT1 in the substrate holding step. By inserting the positioning pins MTp of the upper mold MT1 into the through holes RSHA of the release sheet RS2, the positional relation between the upper mold MT1 and the release sheet RS2 can be easily adjusted.

<Modification 2>

And, for example, various modifications as described above can be applied by combining the various modifications described above.

In addition, some of the contents described in the embodiments are described below.

[Appendix 1]

A method of manufacturing a semiconductor device, comprising the steps of:

(a) preparing a wiring substrate comprising a first main surface, a second main surface opposite the first main surface, a plurality of side surfaces connected to the first main surface and the second main surface, a first terminal exposed at the first main surface, a second terminal exposed at the second main surface and electrically connected to the first terminal, and a semiconductor chip mounted on the first main surface and electrically connected with the first terminal; and (b) after the step (a), sealing the semiconductor chip with the resin to form a sealing body, wherein the step (b) comprises the steps of:

(b1) preparing a first mold including a plurality of suction holes, and a second mold including a cavity and arranged at a position opposite to the first mold;

(b2) after the step (b1), disposing the wiring substrate between the first mold and the second mold and holding the wiring substrate in the first mold such that the first main surface of the wiring substrate faces downward by suctioning the second main surface of the wiring substrate with the plurality of suction holes;

(b3) after the step (b1), supplying the resin into the cavity of the second mold;

(b4) after the step (b2) and the step (b3), forming the sealing body by setting a distance between the first mold and the second mold such that each of the semiconductor chip, the first main surface of the wiring substrate, and the plurality of side surfaces of the wiring substrate is covered with the resin in the cavity;

(b5) forming the sealing body by curing resin.

What is claimed is:

1. A method of manufacturing a semiconductor device, the method comprising:

(a) preparing a wiring substrate including a first main surface, a second main surface opposite the first main surface, a plurality of first terminals exposed on the first main surface, a plurality of second terminals exposed on the second main surface, a plurality of device regions of the first main surface mounting a plurality of semiconductor chips which is electrically connected with the plurality of first terminals, and a plurality of side surfaces connected to outer edges of each of the first main surface and the second main surface; and (b) sealing the plurality of semiconductor chips with a resin to form a sealing body, wherein the step (b) includes:

(b1) preparing a first mold having a plurality of suction holes and a second mold having a cavity and being opposite the first mold;

(b2) after the step (b1), disposing the wiring substrate between the first mold and the second mold, and holding the wiring substrate in the first mold such that the first main surface of the wiring substrate faces downward by suctioning the second main surface of the wiring substrate with the plurality of suction holes;

(b3) after the step (b1), supplying the resin into the cavity of the second mold;

(b4) after the step (b2) and the step (b3), forming the sealing body by setting a distance between the first mold and second mold such that the plurality of semiconductor chips, the first main surface of the wiring substrate, and the plurality of side surfaces of the wiring substrate are respectively covered with the resin in the cavity; and (b5) forming the sealing body by curing the resin.

2. The method of manufacturing a semiconductor device according to claim 1, further comprising the step of:

(c) after step (b), dicing each of the plurality of device region such that the wiring substrate and the sealing body are cut along a cutting region surrounding each of the plurality of device regions, wherein the plurality of device regions of the second main surface of the wiring substrate are covered with a first insulating film, wherein the cutting region of the second main surface of the wiring substrate includes a plurality of first portions exposed from the first insulating film and a plurality of second portions covered with the first insulating film, and wherein in the step (b), the wiring substrate is fixed to the first mold such that the plurality of second portions of the cutting region faces the plurality of suction holes each other.

3. The method of manufacturing a semiconductor device according to claim 2, wherein the plurality of second terminals of the wiring substrate are formed on a first insulating layer of the wiring substrate, and wherein the first insulating film and the first insulating layer face each other without a conductive pattern in each of the plurality of second portions of the second main surface of the wiring substrate.

4. The method of manufacturing a semiconductor device according to claim 3, wherein an outer edge of each of the plurality of device regions has a first side and a second side intersecting the first side, wherein a plurality of conductive patterns is formed on the first insulating layer in the plurality of device regions, wherein the plurality of conductive patterns includes the plurality of second terminals, a plurality of first wirings electrically connected with any of the plurality of second terminals and extending toward the first side, and one end thereof extending toward the first side, and a plurality of second wirings electrically connected with any of the plurality of second terminals and extending toward the second side, and one end thereof being arranged along the second side, and wherein a portion of the plurality of first wirings and a portion of the plurality of second wirings are electrically connected.

5. The method of manufacturing a semiconductor device according to claim 4, wherein, of the plurality of first wirings, a first corner wiring located closest to an intersection of the first side and the second side is electrically connected with any of the plurality of second wirings.

6. The method of manufacturing a semiconductor device according to claim 5, wherein the first corner wiring is electrically connected with a second corner wiring located closest to the intersection of the first side and the second side among the plurality of second wirings.

7. The method of manufacturing a semiconductor device according to claim 4, wherein a part of the plurality of first wirings and a part of the plurality of second wirings is connected with each other in a wiring layer in which the plurality of second terminals are formed.

8. The method of manufacturing a semiconductor device according to claim 2, wherein the cutting region includes a plurality of first cutting lines extending in a first direction and a plurality of second cutting lines extending in a second direction intersecting the first direction, wherein each of the plurality of second portions is disposed at an intersection of the plurality of first cutting lines and the plurality of second cutting lines, and wherein each of the plurality of first portions is disposed between adjacent second portions.

9. The method of manufacturing a semiconductor device according to claim 1, wherein, in plan view, the wiring substrate includes a first long side extending in a first direction, a second long side opposite the first long side, a first short side extending in a second direction intersecting the first direction, a second short side opposite the first short side, a first outer frame region between the first long side and the plurality of device regions, a second outer frame region between the first short side and the plurality of device regions, a third outer frame region between the second long side and the plurality of device regions, and a fourth outer frame region between the second short side and the plurality of device regions, wherein in step (b), each of the first, second, third, and fourth outer frame regions is covered by the resin, and wherein a width of the first outer frame region in the second direction and a width of the third outer frame region in the second direction are narrower than a width of the second outer frame region in the first direction and a width of the fourth outer frame region of the semiconductor device in the first direction.

10. The method of manufacturing a semiconductor device according to claim 9, wherein each of the first short side and the second short side has a concave portion concave toward the plurality of device regions in plan view, wherein each of the first long side and the second long side does not have the concave portion, wherein the first mold prepared in the step (b1) includes a positioning pin, and wherein in the step (b2), a positional relationship between the first mold and the wiring substrate is controlled in plan view by arranging such that the concave portion of the wiring substrate and the positioning pin overlap each other.

* * * * *